United States Patent [19]

Takata

[11] Patent Number: 5,561,084
[45] Date of Patent: Oct. 1, 1996

[54] METHOD OF MAKING AN INTERCONNECTION STRUCTURE OF A SEMICONDUCTOR DEVICE

[75] Inventor: Yoshifumi Takata, Hyogo-ken, Japan

[73] Assignee: Mitsubishi Denki Kabushiki Kaisha, Tokyo, Japan

[21] Appl. No.: 462,992

[22] Filed: Jun. 2, 1995

Related U.S. Application Data

[62] Division of Ser. No. 274,379, Jul. 13, 1994, Pat. No. 5,442,238, which is a continuation of Ser. No. 858,997, Mar. 30, 1992, abandoned.

[30] Foreign Application Priority Data

Apr. 5, 1991 [JP] Japan ......................... 3-73206

[51] Int. Cl.$^6$ ..................................... H01L 21/44
[52] U.S. Cl. ..................... 437/195; 437/190; 437/981; 437/192; 437/194
[58] Field of Search ..................... 437/190, 195, 437/981, 192, 194

[56] References Cited

U.S. PATENT DOCUMENTS

| | | |
|---|---|---|
| 3,562,604 | 2/1971 | Van Laer et al. . |
| 4,556,897 | 12/1985 | Yorikane et al. . |
| 4,900,695 | 2/1990 | Takahashi et al. . |
| 4,965,226 | 10/1990 | Gootzen ........................... 437/190 |
| 5,082,801 | 1/1992 | Nagata ............................. 437/195 |
| 5,422,312 | 6/1995 | Lee et al. ......................... 437/981 |
| 5,470,790 | 11/1995 | Myers et al. ...................... 437/981 |

FOREIGN PATENT DOCUMENTS 64-80065  3/1989  Japan .

OTHER PUBLICATIONS

Wolf, Silicon Processing for the VLSI Era vol. 1 (1986) Lattice Press pp. 546, 558, 579.

*Primary Examiner*—Tom Thomas
*Assistant Examiner*—Lynne A. Gurley
*Attorney, Agent, or Firm*—Lowe, Price, LeBlanc & Becker

[57] ABSTRACT

A first aluminum interconnection layer includes an aluminum alloy layer 12 and an upper metal layer 13 containing refractory metal. A second aluminum layer 15 is in contact with a surface of upper metal layer 13 through a throughhole 19. A thickness t2 of a contact portion 132 of upper metal layer 13 is smaller than a thickness t1 of a non-contact portion 131. In an interconnection structure for a semiconductor integrated circuit device, the increase in electric resistance by the through-hole is suppressed, and also effects achieved by layer 13 containing refractory metal forming the most upper portion of first aluminum interconnection layer 1A are maintained.

4 Claims, 20 Drawing Sheets

METHOD OF MAKING AN INTERCONNECTION STRUCTURE OF A SEMICONDUCTOR DEVICE

This application is a division of application Ser. No. 08/274,379 filed Jul. 13, 1994, now U.S. Pat. No. 5,442,238, which is a continuation of application Ser. No. 07/858,997 filed on Mar. 30, 1992, now abandoned.

BACKGROUND OF THE INVENTION

1. Field of the Invention

The present invention generally relates to an interconnection structure of a semiconductor device and a manufacturing method thereof and, more particularly, to an interconnection structure of a semiconductor integrated circuit device in which each of multilayer aluminum interconnection layers is connected through connection holes and a manufacturing method thereof.

2. Description of the Background Art

In a semiconductor device, elements such as transistors are usually formed on a semiconductor substrate. A variety of interconnections are formed on the semiconductor substrate in order to connect electrically these elements or an element and an external circuit. A polycrystal silicon film, refractory metal film, refractory metal silicide film, aluminum film, aluminum alloy film, etc. have been used as these interconnections. It has been necessary to decrease interconnection resistance in recent semiconductor integrated circuit devices with high degree of integration in order to achieve a high speed operation. Therefore, a structure of aluminum multi-layer interconnections formed of aluminum films or aluminum alloy films having small specific resistance is indispensable for a semiconductor integrated circuit device.

FIG. 20 is a partial plan view showing one example of a structure of aluminum multi-layer interconnections in a conventional semiconductor integrated circuit device. FIG. 21 is a partial sectional view showing a cross section taken along line XX1—XX1 of FIG. 20.

Referring to these views, a p type well 2 and an n type well 3 are formed in a p type silicon substrate 1. An n type MOS transistor 8 is formed in a p type well 2. A p type MOS transistor 9 is formed in an n type well 3. N type MOS transistor 8 includes n type impurity regions 81, 82 as a pair of source/drain regions and a gate electrode 7 formed therebetween. P type MOS transistor 9 includes p type impurity regions 91, 92 as a pair of source/drain regions and a gate electrode 7 formed therebetween. In order to isolate n type MOS transistor 8 and p type MOS transistor 9 electrically from each other, an isolation oxide film 5 is formed therebetween. An inversion preventing region 4 of p type impurity region is formed under isolation oxide film 5.

First aluminum interconnection layers 1A are formed to be connected with each of n type impurity regions 81, 82 and p type impurity regions 91, 92 through contact holes formed in a silicon oxide film 10. Referring to FIG. 20, a first aluminum interconnection layer 1A connects with n type impurity regions 81 through a contact hole C2. A first aluminum interconnection layer 1A connects with p type impurity region 91 through a contact hole C5. A first aluminum interconnection layer 1A connects with n type impurity region 82 through a contact hole C3 and connects with p type impurity region 92 through a contact hole C4. A first aluminum interconnection layer 1A connects with a gate electrode 7 through a contact hole C1.

A first aluminum interconnection layer 1A includes a barrier metal layer 11, an aluminum alloy layer 12 and an upper metal layer 130. A conventional example of a structure of the first aluminum interconnection layer 1A is disclosed in Japanese Patent Laying-Open No. 64-80065. According to the disclosure, barrier metal layer 11 is formed of $MoSi_x$ having a film thickness of about 100–200 Å. Aluminum alloy layer 12 is formed of Al—Cu—Si alloy having a film thickness of 4000–6000 Å. Upper metal layer 130 is formed of $MoSi_x$ having a film thickness of about 100–1000 Å.

A second aluminum interconnection layer 2A (15) connects with a first aluminum interconnection layer 1A through a through-hole T (19). An interlayer insulating film 14 is formed between first aluminum interconnection layer 1A and second aluminum interconnection layer 2A. A passivation film 16 is formed on second aluminum interconnection layer 2A.

A method of forming the interconnection structure shown in FIG. 21 will be described. FIGS. 22 through 32 are partial sectional views showing a sectional structure in respective steps of a manufacturing method of a conventional interconnection structure.

Referring to FIG. 22, p type well 2 and n type well 3 are formed in p type silicon substrate 1. In order to isolate the element forming regions electrically from each other, an isolation oxide film 5 of thick silicon oxide and thereunder an inversion preventing region 4 of p type impurities are formed. N type MOS transistor 8 including n type impurity regions 81, 82 as a pair of source/drain regions is formed in the element forming region of p type well 2. P type MOS transistor 9 including p type impurity regions 91, 92 as a pair of source/drain regions is formed in the element forming region of n type well 3. Silicon oxide film 10 is formed having contact holes through which each surface of n type impurity regions 81, 82 and p type impurity regions 91, 92 is exposed.

As shown in FIG. 23, barrier metal layer 11 including refractory metal is formed to connect with each of n type impurity regions 81, 82 and p type impurity regions 91, 92 using a reactive sputtering method. Aluminum alloy layer 12 is formed on barrier metal layer 11 using the sputtering method. Upper metal layers 130 including refractory metal is formed on aluminum alloy layer 12 using the sputtering method.

Referring to FIG. 24, a photoresist film 17 is formed on upper metal layer 130. Only predetermined regions 17a are subjected to exposure, as indicated by the allows, so as to pattern photoresist film 17.

As shown in FIG. 25, photoresist film 17 undergoes development and only exposed portions 17a are selectively removed.

Referring to FIG. 26, upper metal layer 130, aluminum alloy layer 12 and barrier metal layer 11 are selectively etched away by reactive ion etching using photoresist film 17 as a mask.

As shown in FIG. 27, interlayer insulating film 14 is formed on the whole surface.

As shown in FIG. 28, a photoresist film 18 is formed on interlayer insulating film 14. Only a predetermined region 18a is subjected to exposure, as indicated by the arrows, so as to pattern photoresist film 18.

As shown in FIG. 29, photoresist film 18 undergoes development and exposed portion 18a is selectively removed.

As shown in FIG. 30, through-hole 19 is formed by selectively removing interlayer insulating film 14 using photoresist film 18 as a mask.

As shown in FIG. 31, second aluminum interconnection layer 15 is formed to contact a surface of upper metal layer 130 through through-hole 19.

Finally, referring to FIG. 32, passivation film 16 is formed to cover a surface of second aluminum interconnection layer 15.

In the above described interconnection structure, as first aluminum interconnection layer 1A, a combination including refractory metal 11, aluminum alloy layer 12 and upper metal layer 130 is use. Barrier metal layer 11 is used in such a structure of aluminum interconnection layers for the following reasons.

(i) If aluminum directly contacts a silicon substrate (impurity-diffused-region) in a contact portion, abnormal reaction (alloy spike) is locally caused. The reacted layer then penetrates the impurity-diffused-region and extends below the silicon substrate. As a result, junction leakage of the impurity-diffused-region is caused. In order to prevent the leakage, the barrier metal layer is formed to contact directly the silicon substrate (the impurity-diffused-region).

(ii) Silicon in an aluminum alloy layer deposits in a contact portion because of solid phase epitaxial growth, so that poor contact is caused. In order to prevent it, the barrier metal layer is formed under the aluminum alloy layer.

The reasons for forming upper metal layer 130 including refractory metal on aluminum alloy layer 12 are as follows.

(a) In order to remove a first aluminum interconnection layer selectively, or to form a through-hole reaching a surface of the first aluminum interconnection layer, a photoresist film is formed on the first aluminum interconnection layer. Photoresist film is then subjected to exposure selectively. Light incident on the photoresist film reaches the surface of the first aluminum interconnection layer. If the uppermost portion of the first aluminum interconnection layer is formed of aluminum alloy layer, light penetrated the photoresist film reflects on the surface of the aluminum alloy layer. The reflected light enlarges the exposed region of the photoresist film. The enlargement causes errors in pattern dimensions of the photoresist film.

FIG. 33 is a sectional view showing a problem when the photoresist film formed on the first aluminum interconnection layer is exposed in order to be selectively removed. The first aluminum interconnection layer is formed of barrier metal layer 11 and aluminum alloy layer 12. Photoresist film 17 is formed on aluminum alloy layer 12. Light is directed onto a predetermined exposed region 17a (indicated by dotted lines), as indicated by the arrows, in the patterning of photoresist film 17. The incident light reflects on the surface of aluminum alloy layer 12 as indicated by the arrow and is directed also to a region 17b (indicated by a two-dotted line) other than predetermined exposed region 17a. Thus, the reflected light enlarges the exposed portion of photoresist film 17, so that errors are caused in dimensions of a finished resist pattern.

FIG. 34 is a sectional view showing a problem when a photoresist film formed on a first aluminum interconnection layer is exposed to form a through-hole reaching a surface of the first aluminum interconnection layer. Interlayer insulating film 14 is formed on aluminum alloy layer 12 which is the uppermost portion of the first aluminum interconnection layer. In order to form the through-hole in interlayer insulating film 14, that is, in order to remove interlayer insulating film 14 selectively, photoresist film 18 is formed. Light is directed only to a predetermined exposed region 18a of photoresist film 18, as indicated by the arrows. The incident light passes through photoresist film 18 and also reaches a surface of aluminum alloy layer 12. The light reflected on the surface of aluminum alloy layer 12 is directed not only to a predetermined exposed region 18a (indicated by dotted lines), but also to a region 18b (indicated by a two-dotted line). Consequently, the exposed portion of photoresist film 18 is increased and errors are caused in dimensions of the completed resist pattern.

Upper metal layer 130 is formed on aluminum alloy layer 12 in order to solve these problems. That is, upper metal layer 130 including refractory metal is formed on aluminum alloy layer 12 so as to reduce light reflected on a surface of a first aluminum interconnection layer when a photoresist film is subjected to exposure. The manufacturing steps corresponding to FIGS. 33 and 34, respectively, are shown in FIGS. 24 and 28.

(b) If the upper portion of a first aluminum interconnection layer is formed of an aluminum alloy layer, a protrusion (hillock) of aluminum grows in solid phase from a surface of the aluminum alloy layer by heat treatment etc. in the succeeding step where a silicon oxide film and a photoresist are formed on the first aluminum interconnection layer.

FIG. 35 is a partial sectional view showing a problem when a hillock is formed. Aluminum alloy layer 12 is formed on the uppermost portion of the first aluminum interconnection layer. Interlayer insulating film 14 of a silicon oxide film etc. is formed on the aluminum alloy layer 12. Patterned photoresist film 18 is formed so as to form a through-hole in interlayer insulating film 14. By heat treatment in a step of forming interlayer insulating film 14 and photoresist film 18, a hillock 12a is formed on a surface of aluminum alloy layer 12. A protrusion 14a is formed, resulting from the hillock, in interlayer insulating film 14, so that photoresist film 18 formed on protrusion 14a is thinner than photoresist film 18 on other regions. As a result, if etching process is performed using photoresist film 18 as a mask, not only a predetermined region 14b to be etched away but also protrusion region 14c of interlayer insulating film 14 is etched away. Hillock 12a of aluminum alloy layer 12, which is the uppermost portion of the first aluminum interconnection layer is then exposed and problem arises that hillock 12a is short-circuited with a second aluminum interconnection layer formed thereon.

In order to solve such problems, photoresist film 18 is formed thick, and also upper metal layer 130 including refractory metal is formed as the uppermost portion of the first aluminum interconnection layer. The manufacturing step corresponding to FIG. 35 when upper metal layer 130 including refractory metal is formed on aluminum alloy layer 12 is shown in FIG. 29.

(c) An interlayer insulating film and a passivation film are formed on a first aluminum interconnection layer. The first aluminum interconnection layer is sometimes cut off by film stress of these upper insulating films. An upper metal layer containing refractory metal is formed on an aluminum alloy layer so as to enhance resistance to such a stress migration phenomenon. The upper metal layer is also formed on the aluminum alloy layer in order to prevent the whole first aluminum interconnection layer from being cut off when the aluminum alloy layer forming the main portion of the first aluminum interconnection layer is damaged by electromigration. Electromigration is a phenomena in which metallic atoms move when electron current of high density collides with metallic atoms of interconnections and scatters. Through the effect of the electromigration, a damage of the interconnection layer called void is caused along a grain boundary. The void gradually grows and current density increases with decreasing cross section of the interconnection layer, resulting in heat generation and disconnection.

(d) If the uppermost portion of a first aluminum interconnection layer is formed of an aluminum alloy layer, a problem arises that it is difficult to remove residues, reaction products, etc. produced in the formation of a through-hole.

FIG. 36 is a sectional view showing a problem when a through-hole exposing a surface of the first aluminum interconnection layer is formed. Through-hole 19 is formed in interlayer insulating film 14 to expose a surface of aluminum alloy layer 12 as the uppermost portion of the first aluminum interconnection layer. In the forming of through-hole 19, residues 20a from the etching step remain on the sidewall of through-hole 19. Residues 20a still remain after a photoresist film formed on interlayer insulating film 14 is removed by ashing. Denatured particles 20b etc. are formed on the bottom surface of through-hole 19, that is, an exposed surface of aluminum alloy layer 12. It is necessary to perform cleaning process so as to remove these residues 20a and denatured particles 20b and to stabilize the interface of the first aluminum interconnection layer and second aluminum interconnection layer in through-hole 19. However, it is difficult to perform the cleaning process by wet chemical process using a solution of acid or alkali. That is because the exposed surface of aluminum alloy layer 12 through through-hole 19 is corroded by the solution of acid or alkali. In order to perform the cleaning process sufficiently by wet chemical process, upper metal layer 13 including refractory metal is formed on aluminum alloy layer 12 as the uppermost portion of the first aluminum interconnection layer.

(e) For the above reasons (a)–(d), an upper metal layer containing refractory metal is formed on the uppermost portion of a first aluminum interconnection layer. However, in a region of a through-hole, aluminum alloy layer 12 forming the first aluminum interconnection layer and second aluminum interconnection layer 15 are connected with upper metal layer 130 interposed. As a result, compared to a structure without upper metal layer 130, a resistance value of a through-hole is larger in such an interconnection structure. For example, when an upper metal layer containing refractory metal of specific resistance of $100 \times 10^{-6} \Omega \cdot$ cm is formed in a thickness of 0.1 μm, a resistance value of a 0.8 by 0.8 μm through-hole connection increases by about 0.2 Ω and it is about two to four times that of a through-hole when an upper metal layer including a refractory metal is not interposed. There are also some cases in which upper metal layer 130 including refractory metal and aluminum alloy layer 12 react and a new alloy layer is formed in heat treatment at 400°–500° C. performed when interlayer insulating layer 14 is formed. For example, when upper metal layer 130 including Ti is formed, refraction of aluminum and titanium proceeds and a resistance value of a through-hole significantly increases.

As described above, even if the above described requirements (a)–(d) are fulfilled when an upper metal layer containing refractory metal is used as the uppermost portion of first aluminum interconnection layer, there is a problem that a resistance value of a through-hole connection is increased. As a result, if, for example, the above-stated interconnection structure is used for a device operating at a high speed, a resistance value of a through-hole connection is increased and thus there is a possibility that the operating speed of the device decreases. In Japanese Patent Laying-Open No. 64-80065, a structure is disclosed in which an upper metal layer of $MoSi_x$ is formed as the uppermost portion of a first aluminum interconnection layer; however, it does not disclose an interconnection structure in which the effect described in the above (a)–(d) are achieved and an increase of a resistance value of a through-hole connection is suppressed.

SUMMARY OF THE INVENTION

One object of the present invention is to suppress an increase of a resistance value of a through-hole connection in an interconnection structure of a semiconductor device.

Another object of the present invention is to decrease residues and stabilize an interface in a region of a through-hole in an interconnection structure of a semiconductor device.

Yet another object of the present invention is to reduce an index of reflection of a first aluminum interconnection layer in regions except where through-holes are formed.

Still another object of the present invention is to prevent the formation of a hillock.

Another object of the present invention is to enhance reliability of interconnection structure so that cutoffs are prevented in a semiconductor device.

Yet another object of the present invention is to produce an interconnection structure capable of suppressing a rise of a resistance value of a through-hole.

Still another object of the present invention is to produce an interconnection structure capable of reducing residues in a region of a through-hole and stabilizing an interface.

Another object of the present invention is to produce an interconnection structure capable of decreasing an index of reflection of the uppermost portion of a first aluminum interconnection layer in regions except where through-holes are formed.

Yet another object of the present invention is to produce an interconnection structure capable of preventing the formation of hillock.

Another object of the present invention is to produce an interconnection structure having high reliability for prevention of cut offs.

In a structure of connecting interconnection for a semiconductor device according to one aspect of the present invention, a first interconnection layer, an insulating layer and a second interconnection layer are included. The first interconnection layer includes upper and lower conductive layers, one on top of the other. The insulating layer has a through-hole reaching a surface of the upper conductive layer and is formed on the first interconnection layer. The second interconnection layer is electrically connected to the first interconnection layer by contact with the upper conductive layer through the through-hole. The upper conductive layer includes a contact portion in contact with the second interconnection layer and a non-contact portion having no contact with the second interconnection layer. The contact portion has a finite thickness less than that of the non-contact portion.

According to a manufacturing method of an interconnection structure for a semiconductor device according to another aspect of the present invention, first, a first interconnection layer including upper and lower conductive layers, one on top of the other is formed. An insulating layer is formed on the first interconnection layer. By removing the insulating layer selectively, a through-hole exposing at least a surface of the upper conductive layer is formed. The upper conductive layer is selectively removed in order that a thickness of the upper conductive layer may be decreased in a portion where the surface of the layer is exposed through the through-hole. The second interconnecting layer is formed on the insulating layer to be in contact with the surface of the upper conductive layer through the through-hole.

According to the present invention, a thickness of a upper conductive layer forming a first interconnection layer in a contact portion (a region where a through-hole is formed) contacting a second interconnection layer is less than that in a non-contact portion. As a result, a rise of the resistance value of a through-hole connection can be suppressed. If a layer containing refractory metal as the upper conductive layer exists at least where a surface portion is exposed through a through-hole, it is possible to clear the surface portion of residues and denatured particles formed in an etching step when the through-hole is formed by a wet chemical process using a solution of acid or alkali. In other words, in order to suppress a rise of a resistance value of a through-hole, the upper conductive layer whose surface is exposed through the through-hole can be as thin as possible.

In regions except where a through-hole is formed, a layer containing refractory metal as the upper conductive layer having no contact with a second interconnection layer is formed to have a thickness larger than that of a contact portion. Because the non-contact portion of the layer containing refractory metal decreases an index of reflection on the uppermost portion of the first interconnection layer, margin to prevent errors of a resist pattern formed on the first interconnection layer can be increased. The layer containing refractory metal in a non-contact portion prevents the formation of a hillock on a surface of the lower conductive layer in heat treatment. The layer containing refractory metal in a non-contact portion can also prevent the lower conductive layer from being damaged by film stress of an insulating layer formed thereon.

As described above, the layer containing refractory metal forming the first aluminum interconnecting layer can play its original role and suppresses a rise of a resistance value of a through-hole in a portion contacting the second aluminum interconnection layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to the figures, one embodiment of the present invention will be described.

Figure 1:
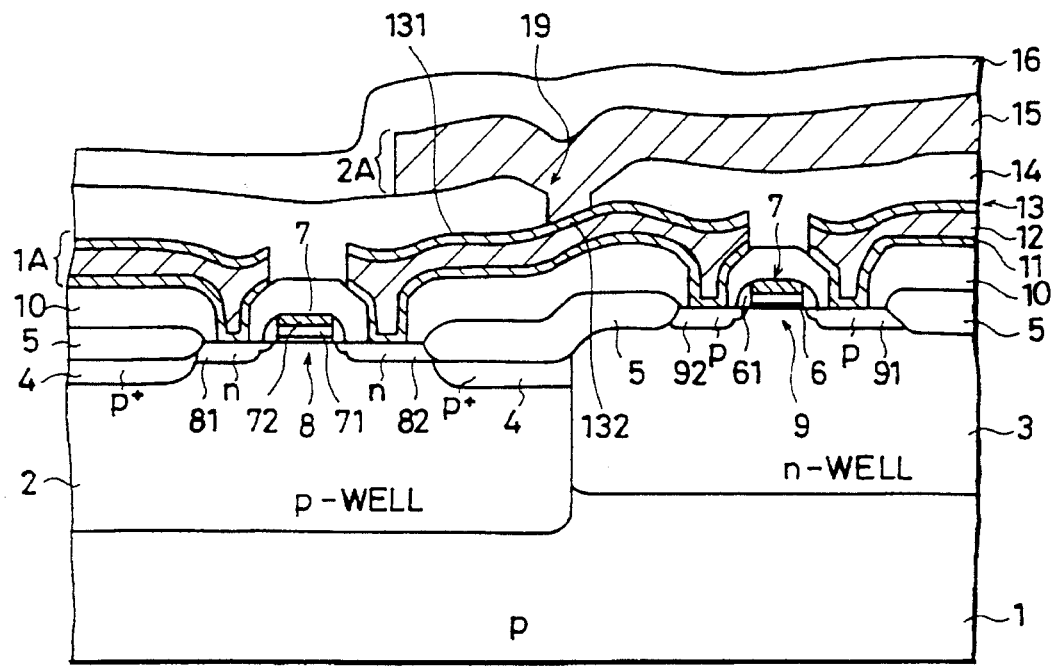
FIG. 1 is a partial sectional view showing one embodiment of an interconnection structure according to the present invention.
Figure 2:
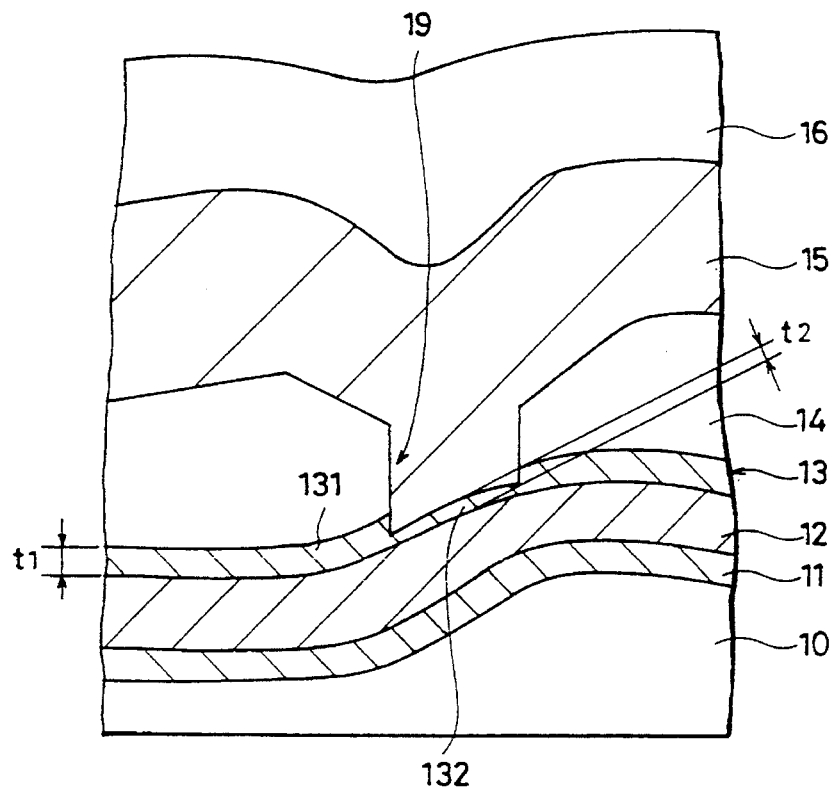
FIG. 2 is a partial sectional view showing an enlarged through-hole portion shown in FIG. 1.

Referring to FIGS. 1 and 2, a p type well 2 and an n type well 3 are formed on a p type silicon substrate. In order to isolate element forming regions of p type well 2 and n type well 3 electrically, an isolation oxide film 5 of a thick silicon oxide film and thereunder an inversion preventing region 4 of a p type impurity region are formed. An n type MOS transistor 8 is formed in the element forming region of p type well 2. N type MOS transistor 8 includes n type impurity regions 81, 82 as a pair of source/drain regions, and a gate electrode 7 formed therebetween. Gate electrode 7 includes a lower portion of a polysilicon layer 71 and an upper portion of a tungsten silicide layer 72. Gate electrode 7 is formed on gate oxide film 6. N type impurity regions 81, 82 have LDD structures. A p type MOS transistor 9 is formed in the element forming region of n type well 3. As n type MOS transistor 8, P type MOS transistor 9, includes p type impurity regions 91, 92 as a pair of source/drain regions and, a gate electrode 7 formed therebetween.

A first aluminum interconnection layer 1A is formed on silicon oxide film 10 to connect with each of n type impurity regions 81, 82 and p type impurity regions 91, 92. A first aluminum interconnection layer 1A comprises a barrier metal layer 11 and an aluminum alloy layer 12 and an upper metal layer 13. Barrier metal layer 11 is formed of a TiN film, etc. Aluminum alloy layer 12 is formed of a film of aluminum alloy, such as Al—Si alloy, Al—Si—Cu alloy, and Al—Cu alloy. Upper metal layer 13 is formed of titanium-tungsten (Ti—W) alloy, molybdenum silicide (MoSi), tungsten silicide (WSi), tungsten (W), titanium nitride (TIN), etc.

An interlayer insulating film 14 is formed to cover first aluminum interconnection layer 1A. Interlayer insulating film 14 is provided with a through-hole 19 through which at least a surface of upper metal layer 13 is exposed. By contacting the surface of upper metal layer 13 through through-hole 19, a second aluminum interconnection layer 15 is formed to connect electrically with first aluminum interconnection layer 1A. A passivation film 16 is formed to cover second aluminum interconnection layer 15.

In an interconnection structure as described above, upper metal layer 13 forming the most upper layer portion of first aluminum interconnection layer 1A has two thicknesses t1, t2. As shown in FIG. 2, a portion of upper metal layer 13 which does not contact second aluminum interconnection layer 15, that is, a non-contact portion 131 covered with interlayer insulating film 14 has a thickness t1. A contact portion 132 of upper metal layer 13 contacting second aluminum interconnection layer 15 through a through-hole 19 has a thickness t2. Thickness t2 of contact portion 132 is smaller than a thickness t1 of non-contact portion 131. A thickness t1 is preferably 500 Å or more and thickness t2 is less than 500 Å. Thus, by making the thickness of contact portion 32 of the upper metal layer contacting second aluminum interconnection layer 15 through through-hole 19 smaller than the thickness of non-contact portion 131, it is possible to suppress a rise of a resistance value of a through-hole. If thickness t1 of non-contact portion 131 is set at 500 Å or more, an index of reflection of the surface can be stabilized at a low value as described below. Non-contact portion 131 of upper metal layer reduces the index of reflection of the surface of the uppermost portion of the first aluminum interconnection layer, prevents the formation of a hillock in aluminum alloy layer 12 by heat treatment of the succeeding step, and prevents damage of aluminum alloy layer 12 by film stress etc. of interlayer insulating film 14. By setting a thickness of contact portion 132 to be smaller, it is possible to suppress a rise of a resistance value of a through-hole as well as to maintain the role of upper metal layer 13.

One embodiment of a method of forming an interconnection structure according to the present invention will be described.

Figure 3:
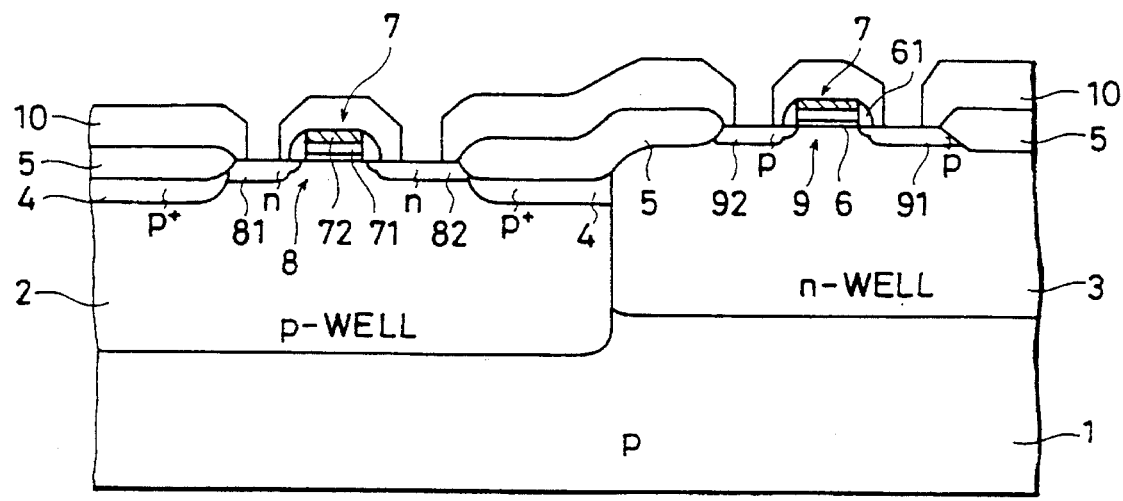
FIGS. 3 through 15 are partial sectional views showing in order sectional structures in respective steps of a manufacturing method of a structure of connecting interconnection of the present invention.

Referring to FIG. 3, a p type well 2 and an n type well 3 are formed on a p type silicon substrate 1. In order to isolate the element forming regions of p type well 2 and n type well 3 electrically from each other, an isolation oxide film 5 of a thick silicon oxide film and thereunder an inversion preventing region 4 of a p type impurity region are formed. An n type MOS transistor 8 is formed in the element forming region of p type well 2 and a p type MOS transistor 9 is formed in the element forming region of the n type well. A silicon oxide film 10 is provide with contact holes through which each surface of n type impurity regions 81, 82 as source/drain regions of n type MOS transistor 8 and source/drain regions 91, 92 of p type MOS transistor 9 is exposed.

Figure 4:
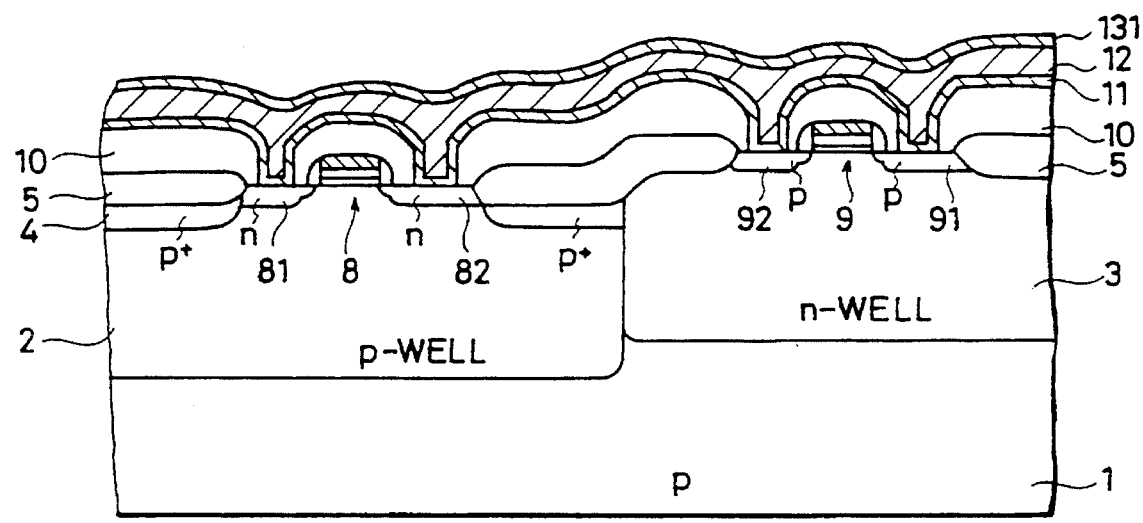

Referring to FIG. 4, a barrier metal layer 11 is formed in a thickness of about 1000 Å using a reactive sputtering method in order to contact each surface of n type impurity regions 81, 82 and p type impurity regions 91, 92 through the contact holes. On barrier metal layer 11, an aluminum alloy layer 12 is formed in a thickness of about 2000–10000 Å using a sputtering method. Furthermore, on aluminum alloy layer 12 upper metal layer 131 including refractory metal is formed to have a thickness of 500 Å or more by using the sputtering method.

Figure 5:
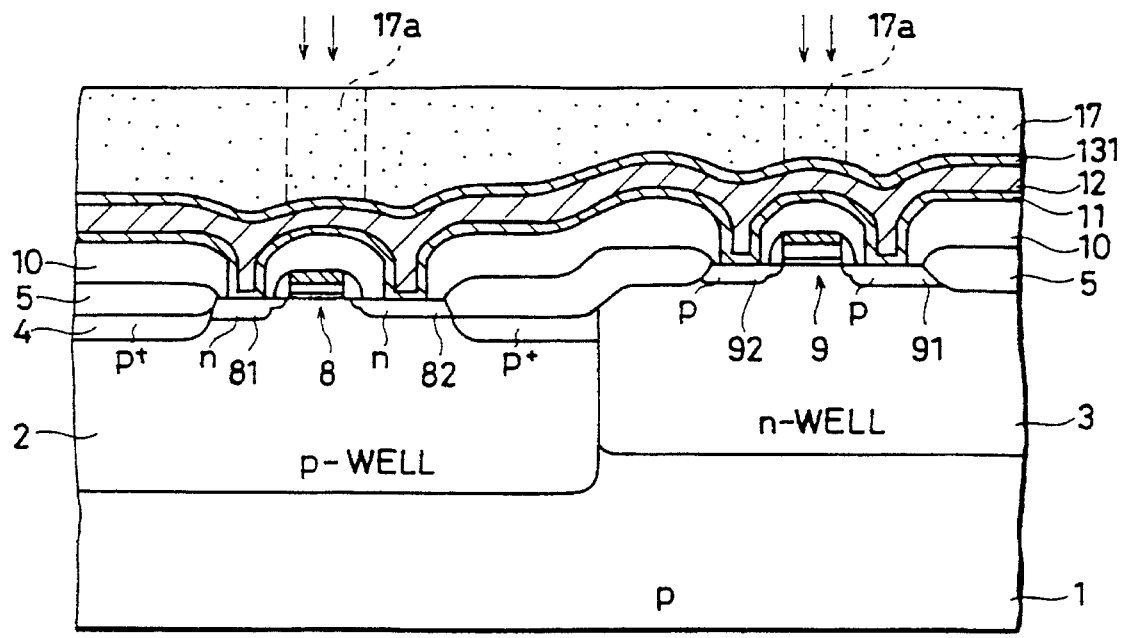

As shown in FIG. 5, a photoresist film is formed on the whole surface. Light is directed only to a predetermined exposed region 17a of photoresist 17, as indicated by the arrows. Since upper metal layer 131 is formed on aluminum alloy layer 12 at that time, a degree in which light directed to photoresist film 17 reflects on the surface of upper metal layer 131 is reduced. Consequently, a degree in which an exposed region of photoresist film 17 is enlarged by the reflected light is reduced.

Figure 6:
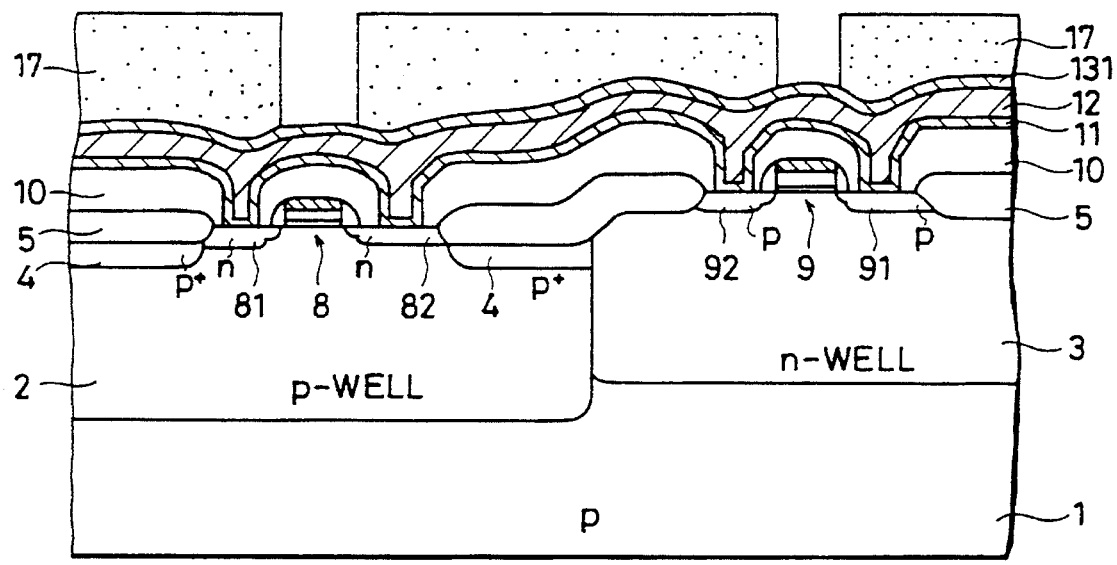

Referring to FIG. 6, a resist is patterned by subjecting photoresist film 17 to a development process.

Figure 7:
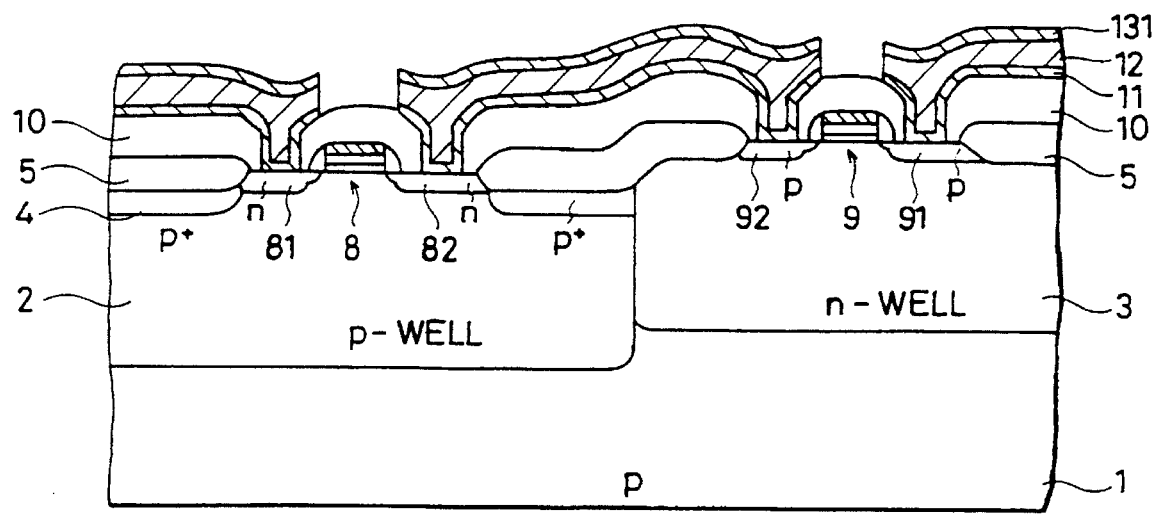

As shown in FIG. 7, upper metal layer 131, aluminum alloy layer 12 and barrier metal layer 11 are selectively removed by a magnetically enhanced reactive ion etching (RIE) technology using a patterned photoresist film as a mask. The etching step of upper metal layer 131, aluminum alloy layer 12 and barrier metal layer 11 are performed in the same magnetically enhanced reactive ion etching apparatus. Kinds of gas used in the etching step are $SiCl_4$, $Cl_2$, $CF_4$, $SF_6$, etc. A silicon substrate 1 is heated to about 140° C. in the etching step.

Figure 8:
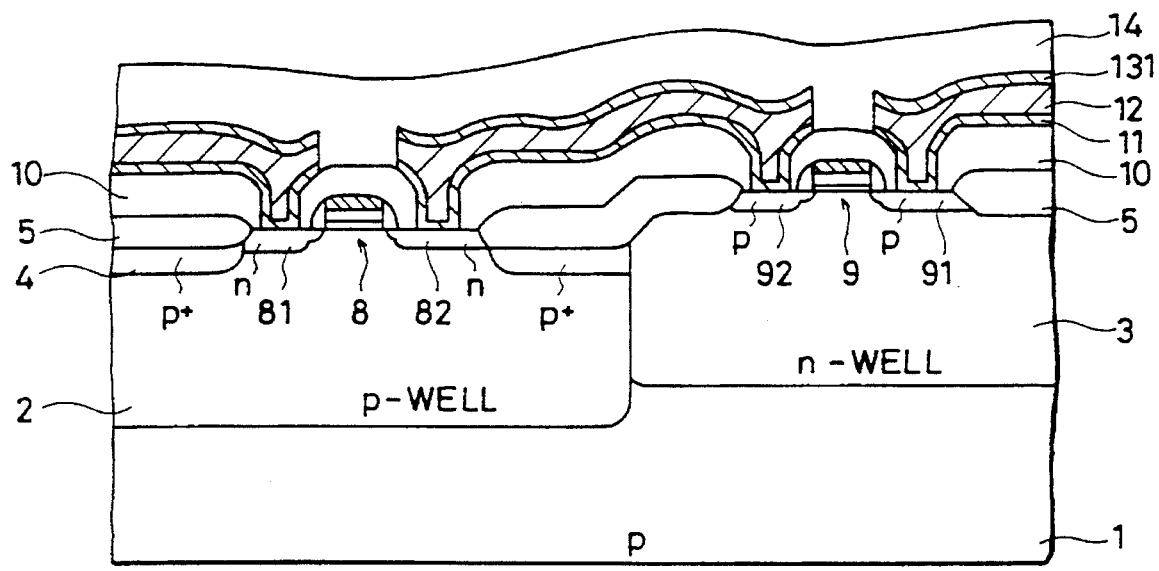

Referring to FIG. 8, an interlayer insulating film 14 is formed on the whole surface. As one example, the interlayer insulating film is formed of a lower portion of a silicon oxide film, a middle layer portion of an SOG film and an upper layer portion of a silicon oxide film. The silicon oxide film forming the upper layer portion and the lower layer portion is formed using $SiH_4$ gas or $N_2O$ gas as a raw material gas at a heating temperature of about 300° C. by a plasma CVD method. The upper silicon oxide film is formed in a thickness of about 6000 Å and the lower silicon oxide film is formed in a thickness of about 2000 Å. The SOG film forming the middle layer portion is formed by spin coating a solution of SOG having a silicon concentration of 1–5%. The SOG film is formed through subjecting a baking process on a hot plate at a temperature of 150°–450° C. and thereafter firing for 15–30 minutes at the temperature of about 400° C.

Figure 9:
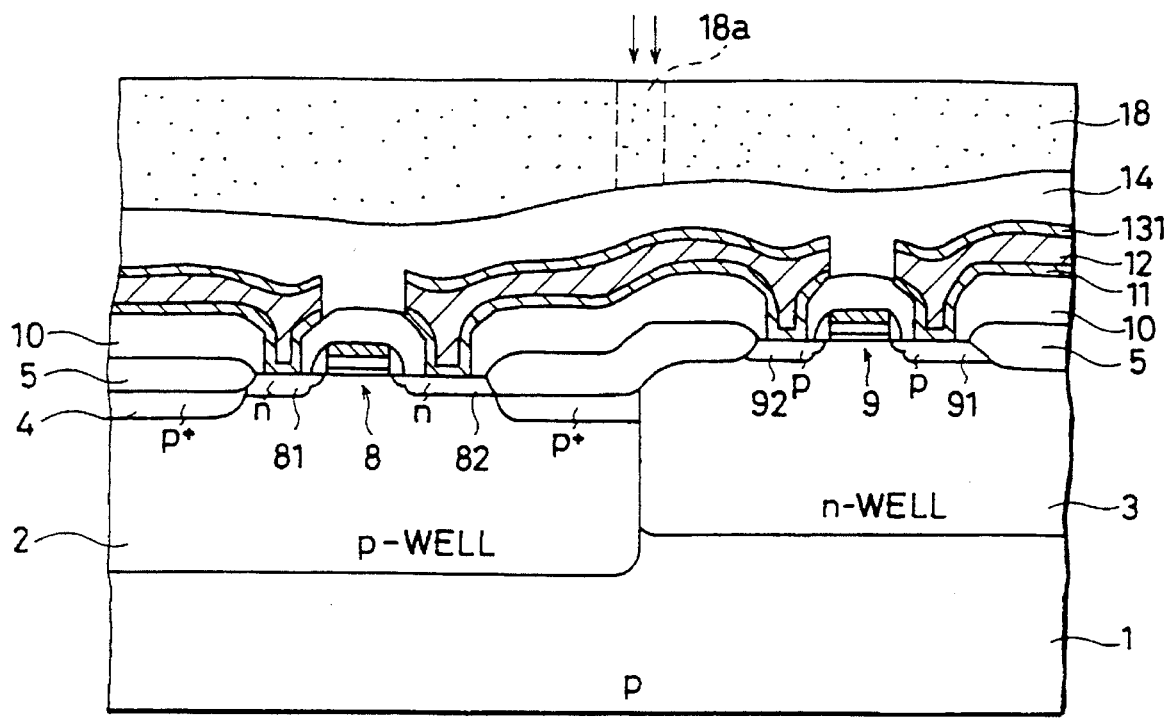

Referring to FIG. 9, a photoresist 18 is formed on the whole surface. By directing light only at a predetermined region 18a, photoresist film 18 undergoes an exposure process. Since upper metal layer 131 is formed on aluminum alloy layer 12 at that time, a degree in which the directed light penetrating interlayer insulating film 14 reflects on the surface of upper metal layer 131 is reduced. Consequently, a degree in which an exposed region of photoresist film 18 is enlarged by the reflected light is reduced.

Figure 10:
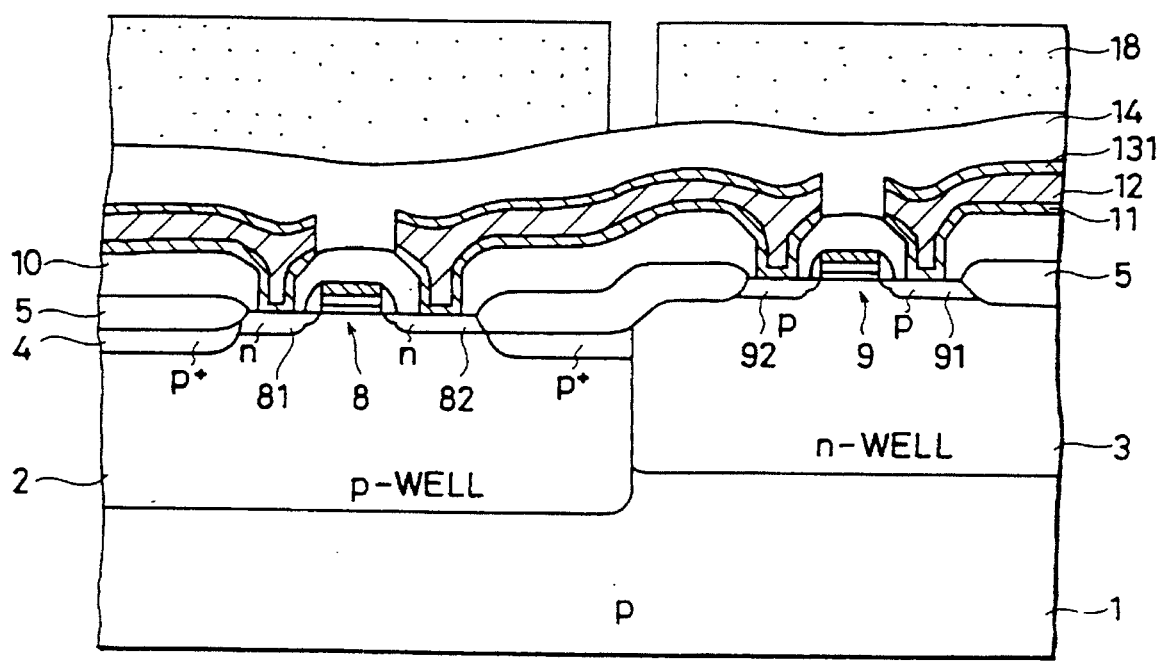

Referring to FIG. 10, photoresist film 18 is patterned by a development process.

Figure 11:
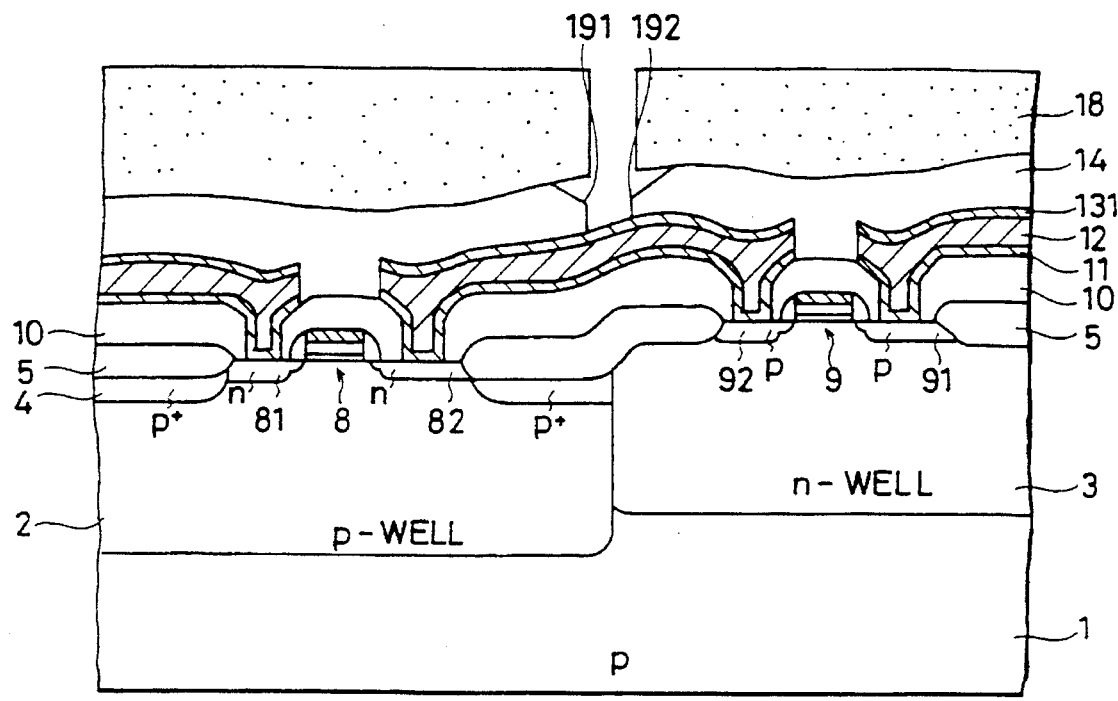

As shown in FIG. 11, interlayer insulating film 14 is wet-etched by a dilute solution of hydrofluoric acid using a patterned photoresist film 18 as a mask and removed to a depth of about 4000 Å. Thus, a tapered portion 191 of a through-hole is formed. Then, interlayer insulating film 14 is selectively etched away by an anisotropic etching technology, such as reactive ion etching, and vertical portion 192 of the through-hole is formed to expose the surface of upper metal layer 131. As a gas used in the anisotropic etching, various kinds of combination of gases such as. $CHF_3$ (or $CF_4$) and $O_2$ (or $CO_2$, Ar, He) can be given.

Figure 12:
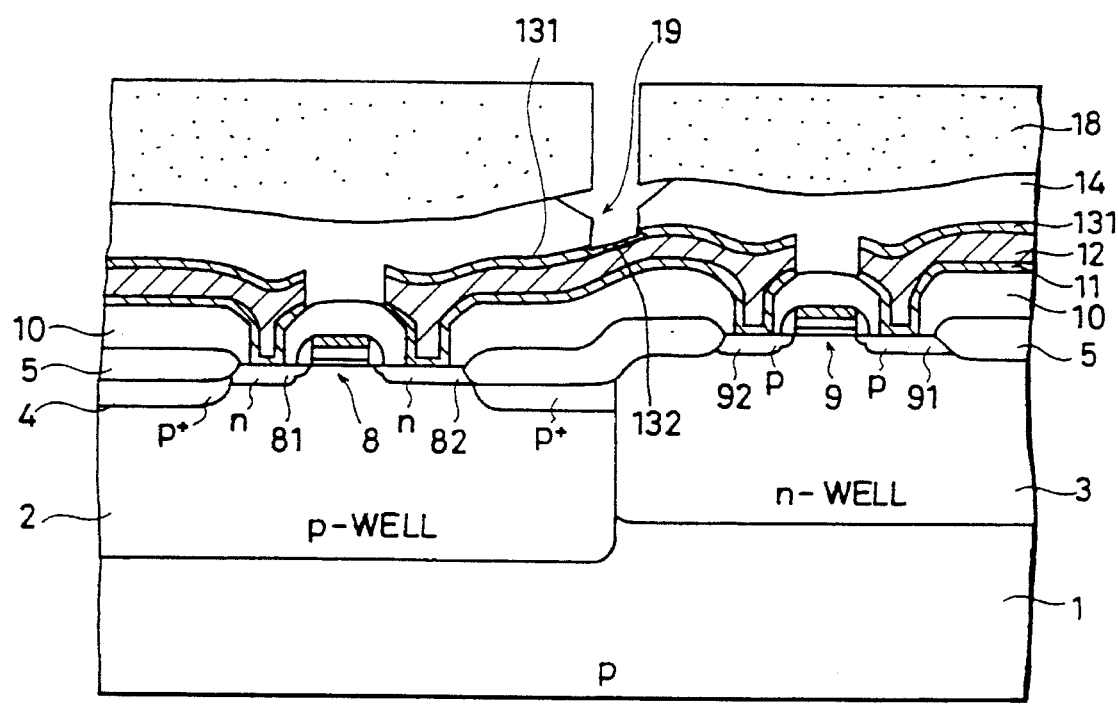

Referring to FIG. 12, only a portion 132 exposing the surface of the upper metal layer is selectively removed to decrease its thickness using photoresist film 18 as a mask. An etching apparatus used may be the same as the apparatus used in the above anisotropic etching step. A kind of gas used in the anisotropic etching step may be the same as the kind used in the etching of interlayer insulating film 14. However, in that case, since upper metal layer 131 including refractory metal is removed at an etching speed of about several tens of Å/min, a gas of at least one selected from a group consisting of $SF_6$, $SiCl_4$, $Cl_2$ and $CF_4$ may be used as the etching gas in order to increase the etching speed. The etching step of the upper metal layer is performed with etching time being controlled such that the thickness of contact portion 132 is a predetermined thickness of less than 500 Å.

Figure 13:
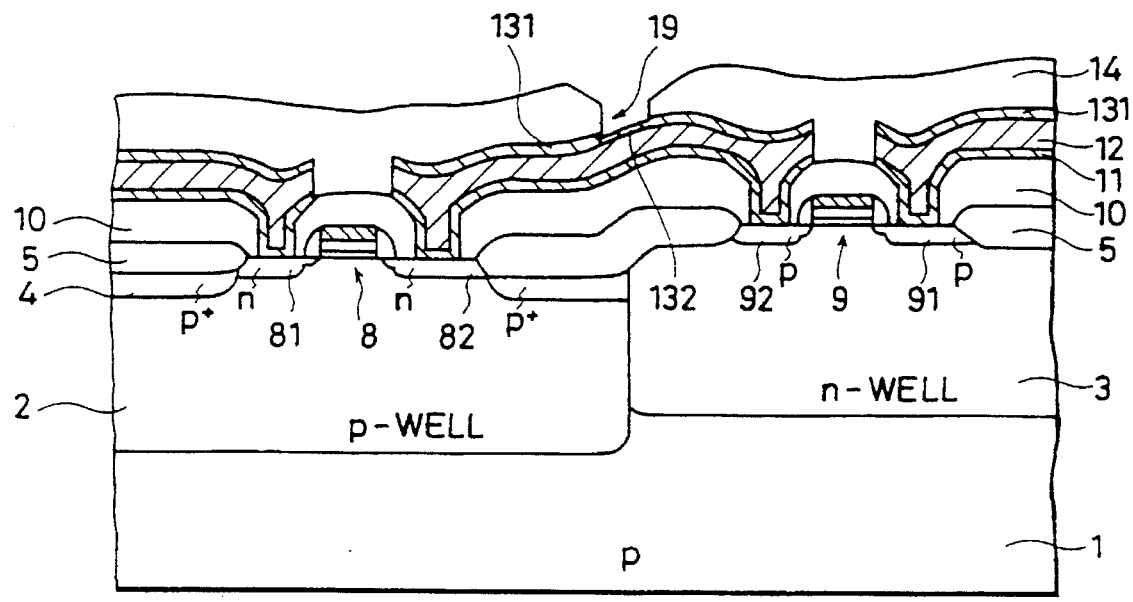

Referring to FIG. 13, photoresist film 18 is removed by ashing, using oxygen plasma. A through-hole 19 is thus formed to expose at least the surface of contact portion 132. At that time, even if the surface of contact portion 132 and the sidewall portion of through-hole 19 are cleaned by a wet chemical process using acid or alkali so as to remove residues and denatured particles existing on these surfaces, contact portion 132 of the upper metal layer is formed on aluminum alloy layer 12, so that a problem such as corrosion of aluminum alloy layer 12 does not arise.

Figure 14:
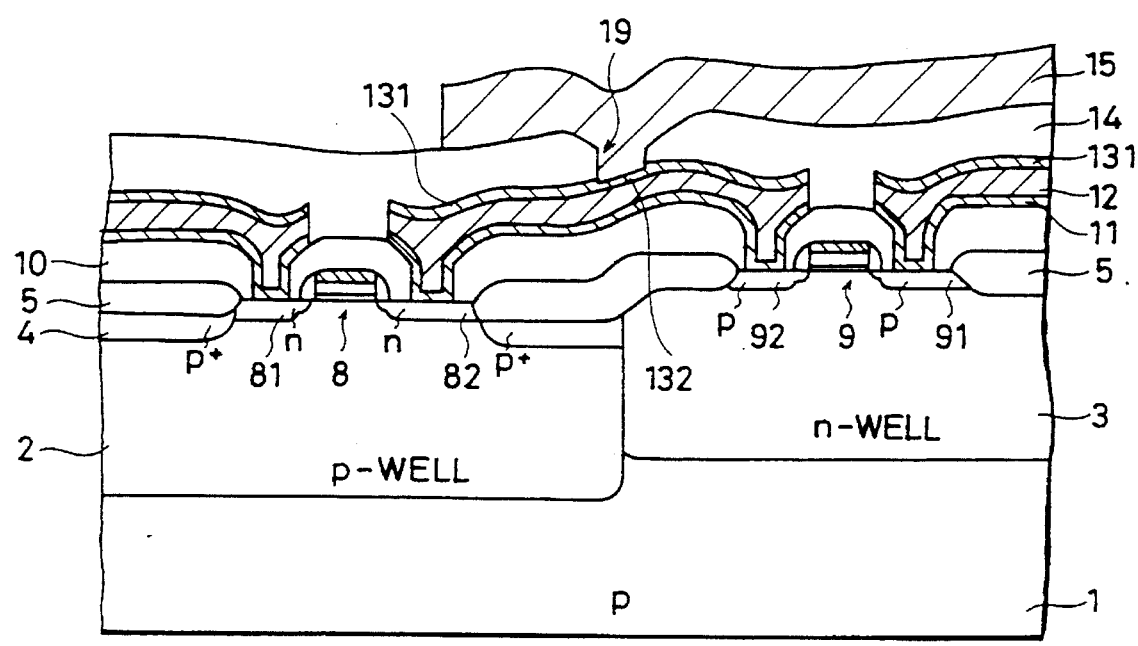

Referring to FIG. 14, second aluminum interconnection layer 15 of aluminum alloy is formed in a thickness of about 7000–15000 Å so as to contact contact portion 132 through through-hole 19 using a sputtering method. Patterning of the second aluminum interconnection layer 15 is performed using a photolithography and the etching step is performed, for example at a heating temperature of about 140° C. using a mixed gas of $SiCl_4$, $Cl_2$ and $CF_4$.

Figure 15:
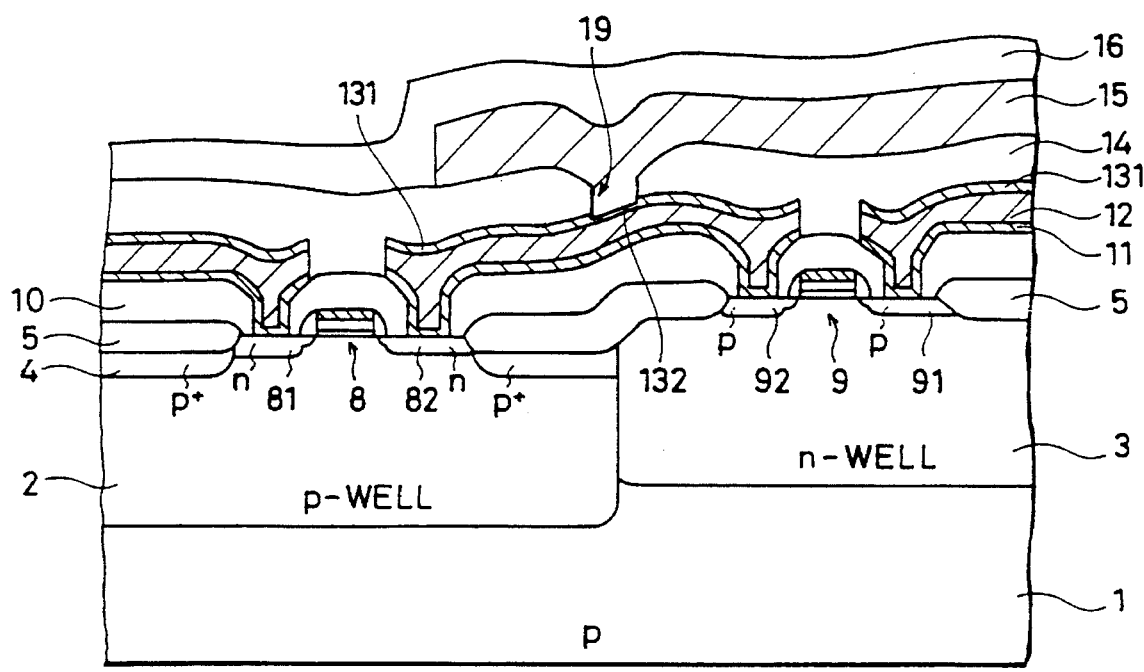

Finally, as shown in FIG. 15, a passivation film 16 of a silicon nitride film is formed in a thickness of about 7000–10000 Å using a plasma CVD method to cover second aluminum interconnection layer 15. The formation of the film is carried out at a heating temperature of about 300° C. using a mixed gas of $SiH_4$ and $NH_3$.

A relation between an index of reflection of light directed in the patterning step of a resist film and a thickness of an upper metal layer will be described.

Figure 16:
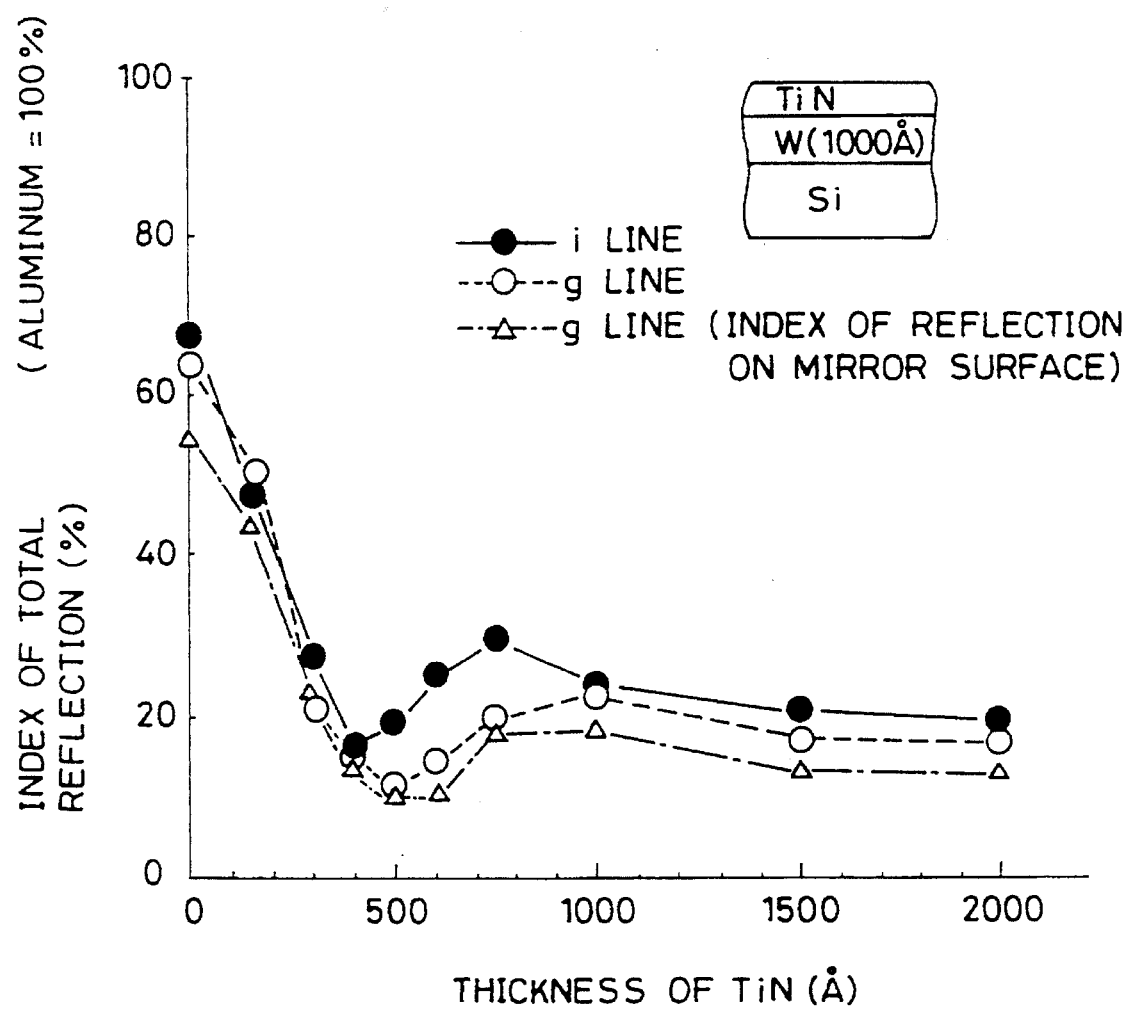
FIG. 16 is a graph showing a relation between a thickness and an index of total reflection of TiN used as an upper metal layer of the present invention.

FIG. 16 is a graph showing a relation between a thickness (Å) of titanium nitride (TiN) and an index of total reflection (%) when an index of reflection on a surface of an aluminum film is assumed to be 100%. As shown in the figure,, a tungsten film having a thickness of 1000 Å is formed on a silicon substrate 1. An index of total reflection of light is measured on a surface of a TiN film with the TiN film being formed on the tungsten film. I-line (365 nm) and g-line (436 nm) are used for irradiation. As can be clearly seen from the figure, when a film forming an upper metal layer is a TiN film, a TiN film having a low index of reflection can be obtained provided the thickness is at least 500 Å or more. However, the range of the thickness includes a range of thickness with which an index of reflection sharply changes with slight change of the thickness, so that it is important to control the thickness in order to obtain a stable index of reflection. Therefore, when a TiN film is used as a film forming an upper metal layer, a film having a thickness of 1000 Å or more is preferable in practice.

Figure 17:
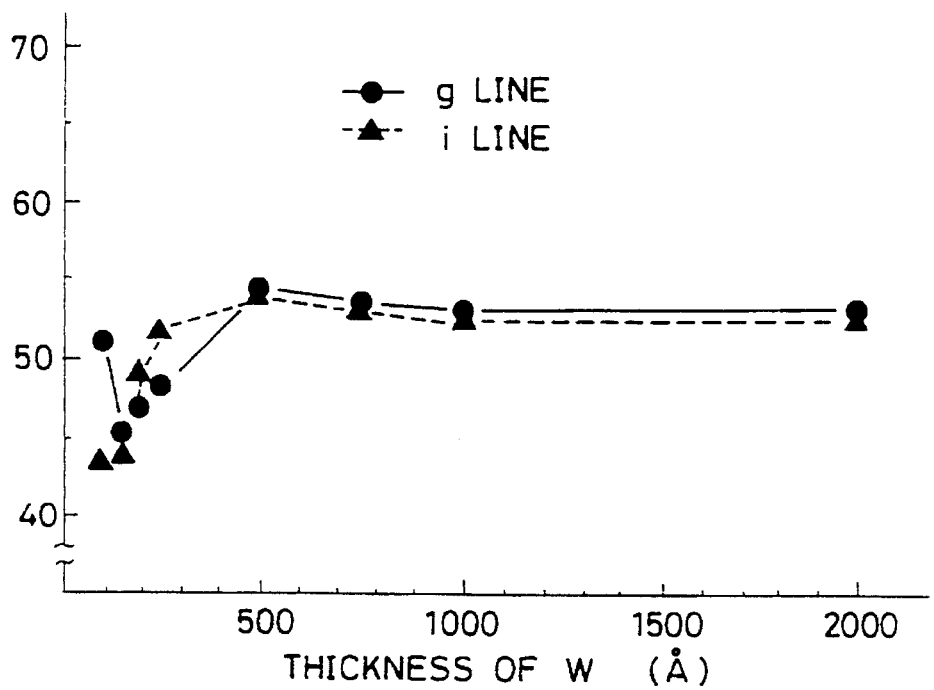
FIG. 17 is a graph showing a relationship between a thickness and an index of total reflection of tungsten used as an upper metal layer of the present invention.

FIG. 17 is a graph showing a relationship between an index of total reflection (%) and a thickness (Å) of tungsten (W). As can be clearly seen from the figure, when a tungsten film is used as a film forming an upper metal layer, a film having an index of reflection stable against changes of a thickness can be obtained provided the thickness is at least 500 Å or more. The tungsten film having a thickness in a range of less than 500 Å is not practical, since an index of reflection of a tungsten film in this range changes sharply with a change of the thickness.

Figure 18:
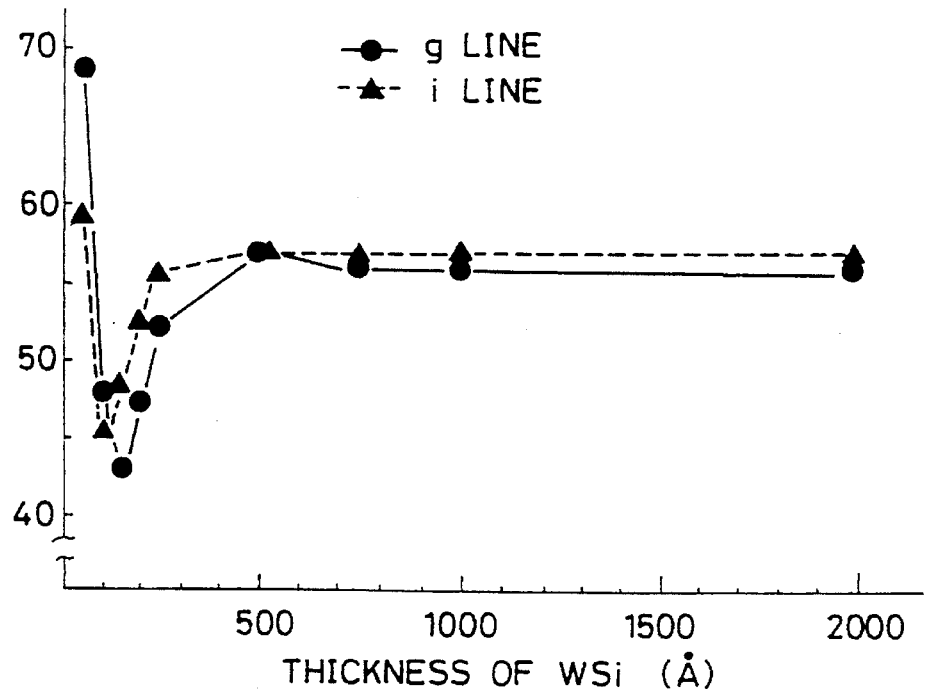
FIG. 18 is a graph showing a relationship between a thickness and an index of total reflection of tungsten silicide used as an upper metal layer of the present invention.

FIG. 18 is a graph showing a relation between an index of total reflection (%) and a thickness (Å) of tungsten silicide (WSi). As can be clearly seen from the figure, a tungsten silicide film having an index of reflection stable against changes of the thickness can be provided if the thickness is 500 Å or more.

The same relationship shown in FIGS. 17 and 18 can be also obtained with titanium-tungsten (Ti—W) film, molybdenum (Mo) film, titanium (Ti) film, etc.

As described above, considering an index of reflection, it is desirable that thickness t1 of non-contact portion 131 of the upper metal layer shown in FIG. 2 is 500 Å or more. When non-contact portion 131 has a thickness of 500 Å or more, the formation of a hillock in lower aluminum alloy layer 12 can be prevented. Furthermore, when non-contact portion 131 has a thickness of 500 Å or more, non-contact portion 131 of the upper metal layer prevents a cutoff of the first aluminum interconnection layer as a whole even if lower aluminum alloy layer 12 is damaged by stress-migration or electro-migration.

The upper limit of thickness t1 of non-contact portion 131 is not particularly defined. However, as thickness t1 increases, a thickness of the whole first aluminum interconnection layer substantially increases and therefore it is difficult to make the surface coplanar with interlayer insulating film 14 formed thereon. It is preferable that thickness t1 of non-contact portion 131 is less than several thousands of Å.

Figure 19:
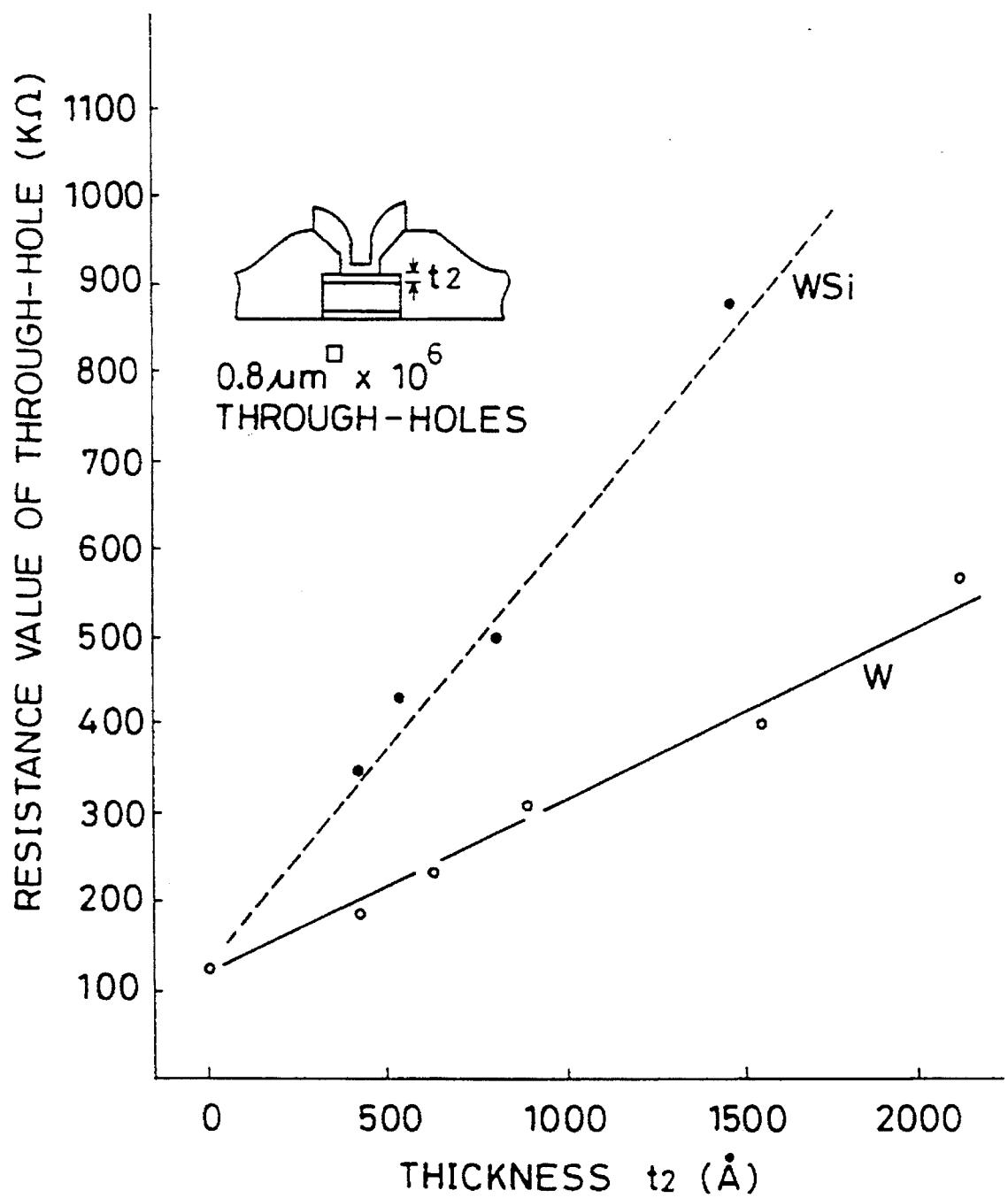
FIG. 19 is a graph showing a relationship between a thickness t2 of a contact portion of an upper metal layer and a resistance value of a through-hole in an interconnection structure of the present invention.
Figure 20:
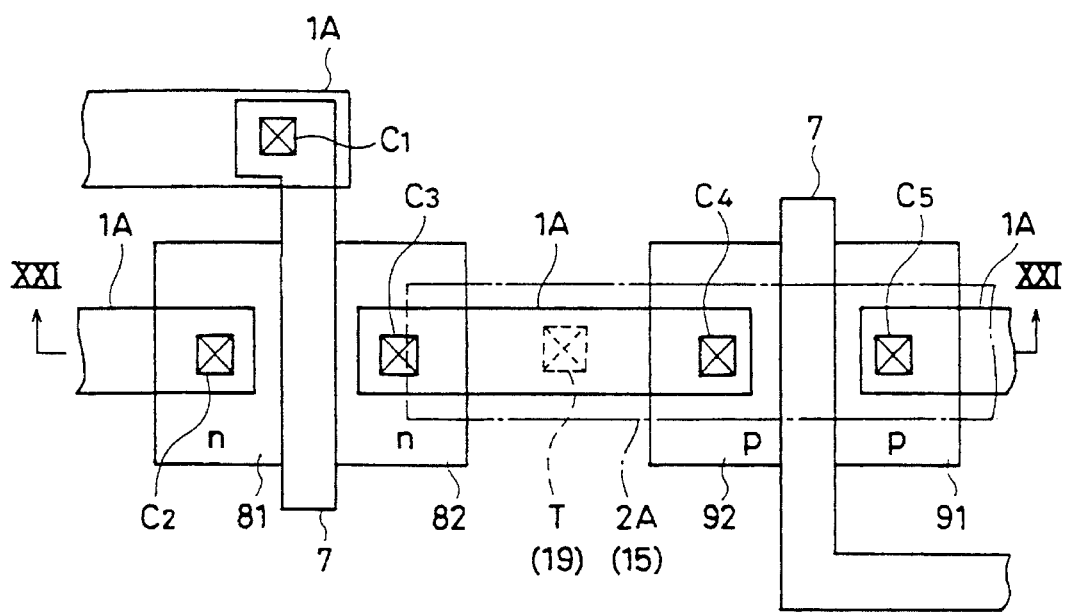
FIG. 20 is a partial plan view showing a conventional interconnection structure.
Figure 21:
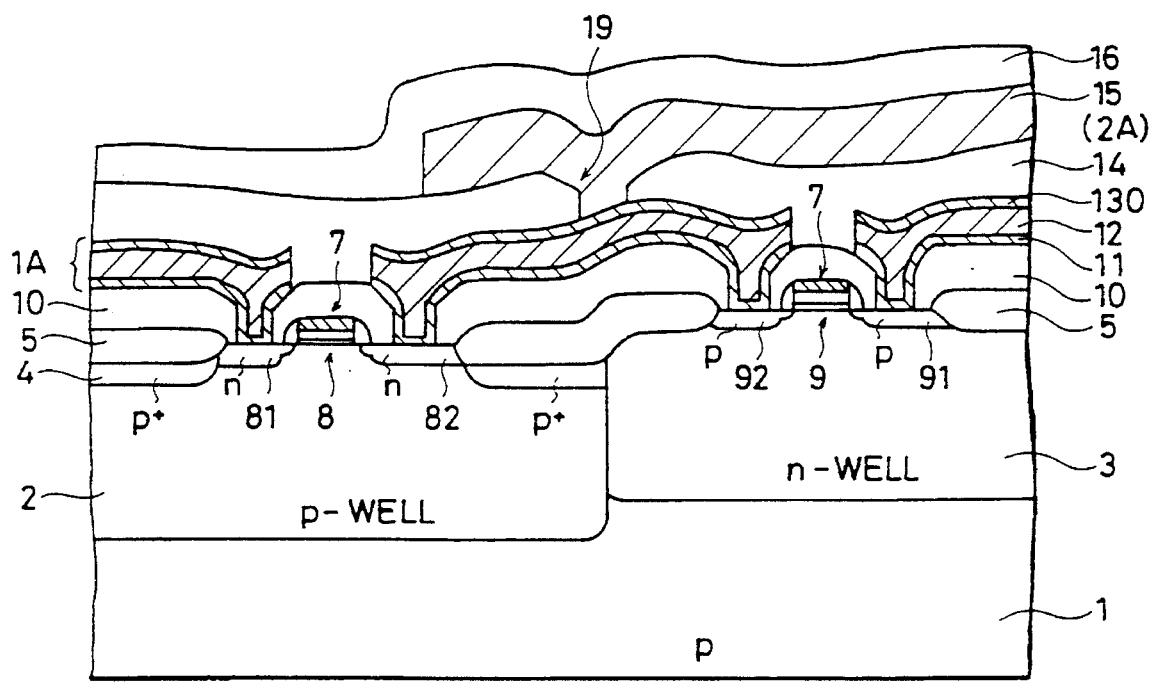
FIG. 21 is a partial sectional view showing a cross section taken along line XXI–XXI in FIG. 20.
Figure 22:
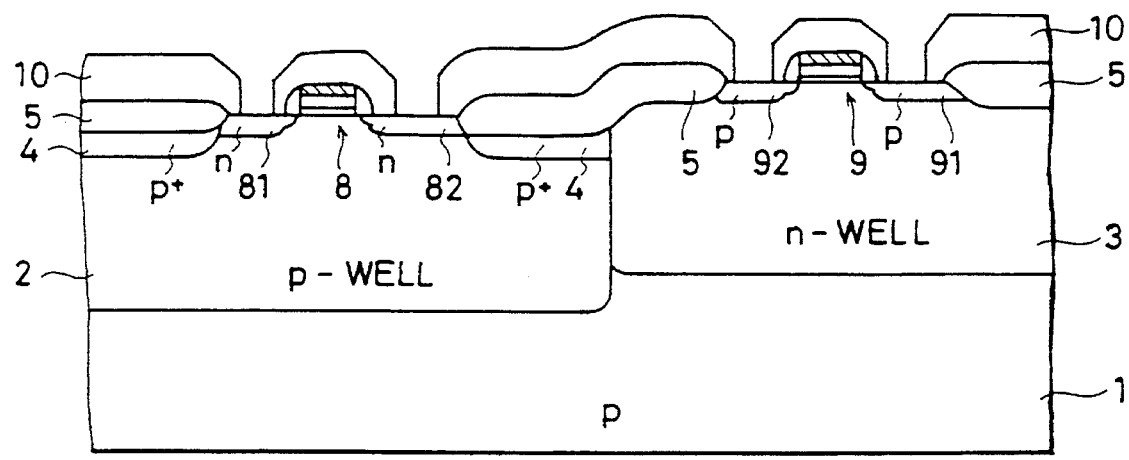
FIGS. 22 through 32 are partial sectional views showing in order sectional structures in respective steps of a manufacturing method of the conventional interconnection structure.
Figure 23:
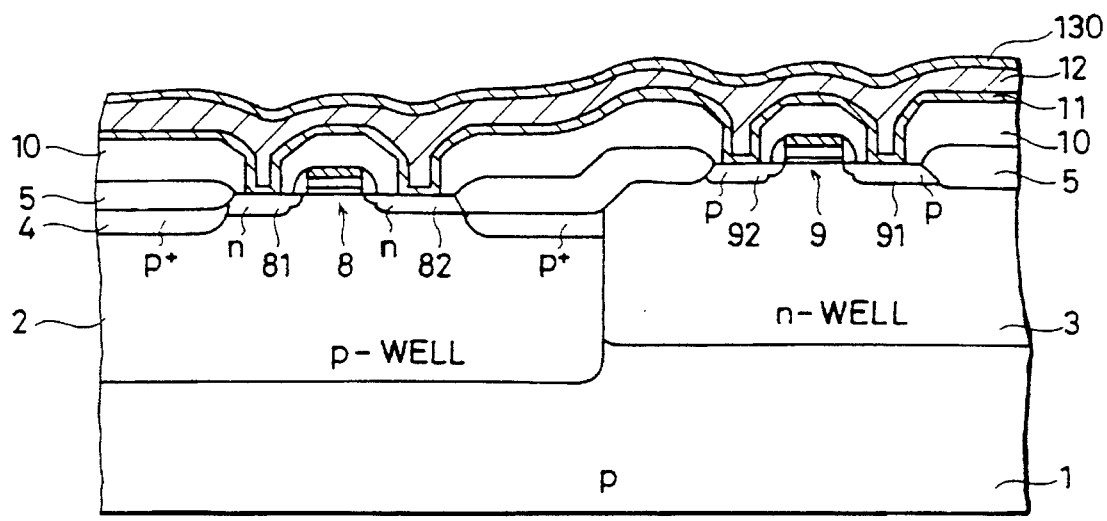
Figure 24:
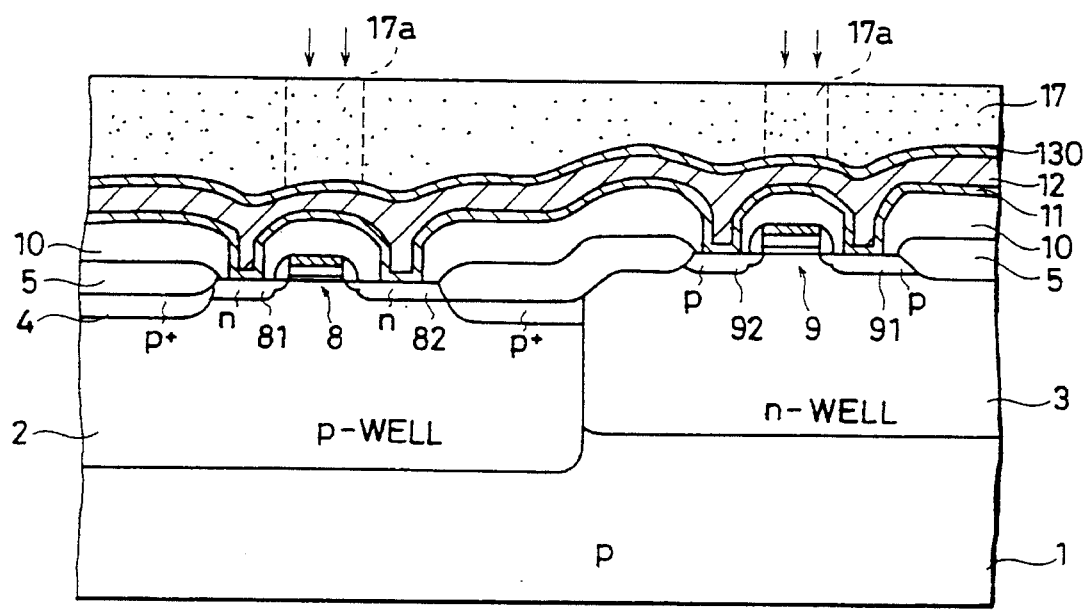
Figure 25:
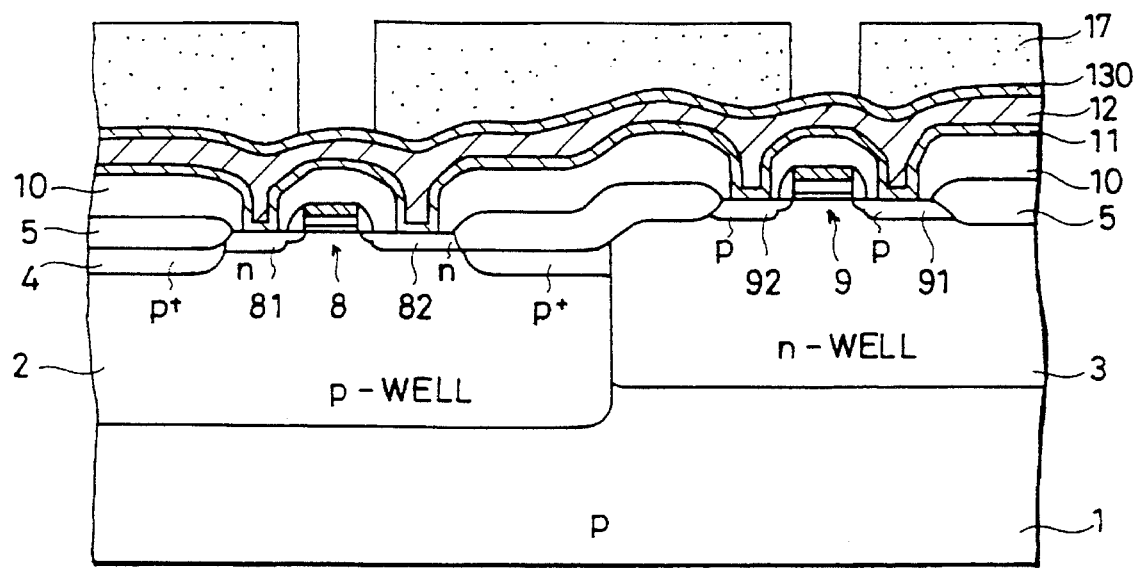
Figure 26:
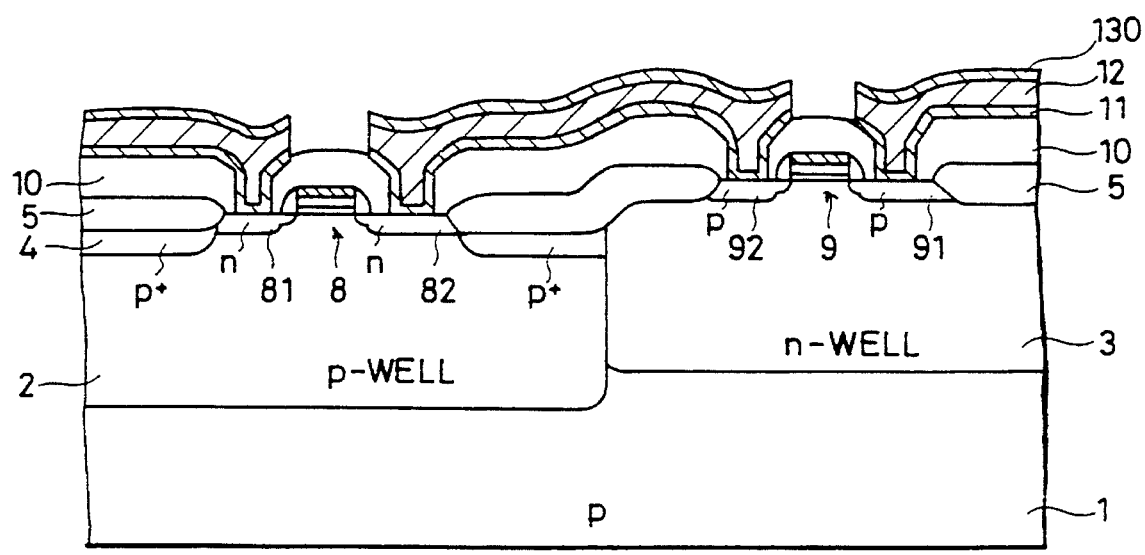
Figure 27:
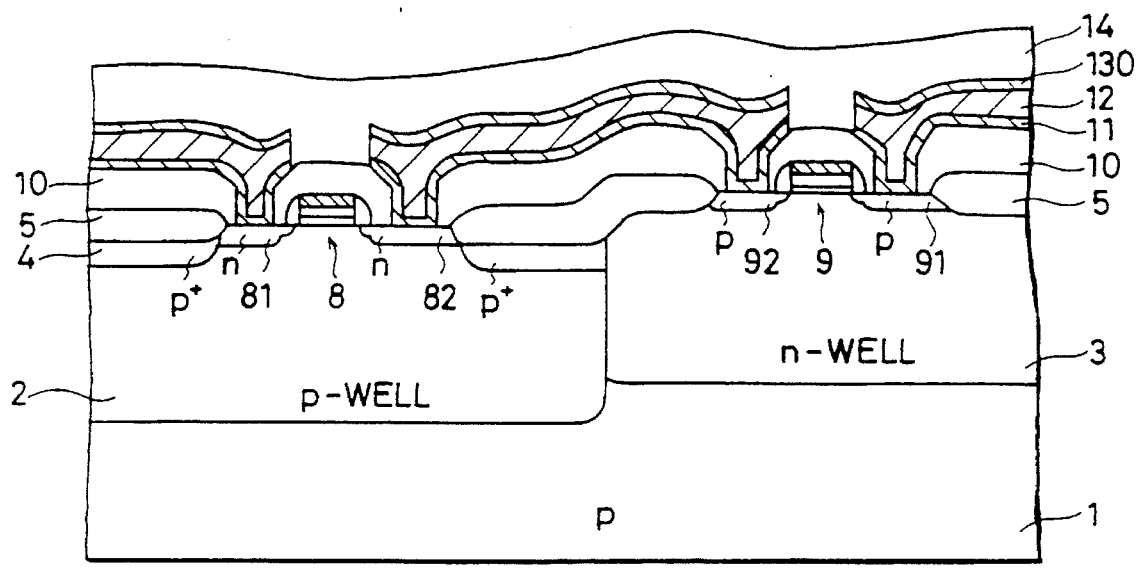
Figure 28:
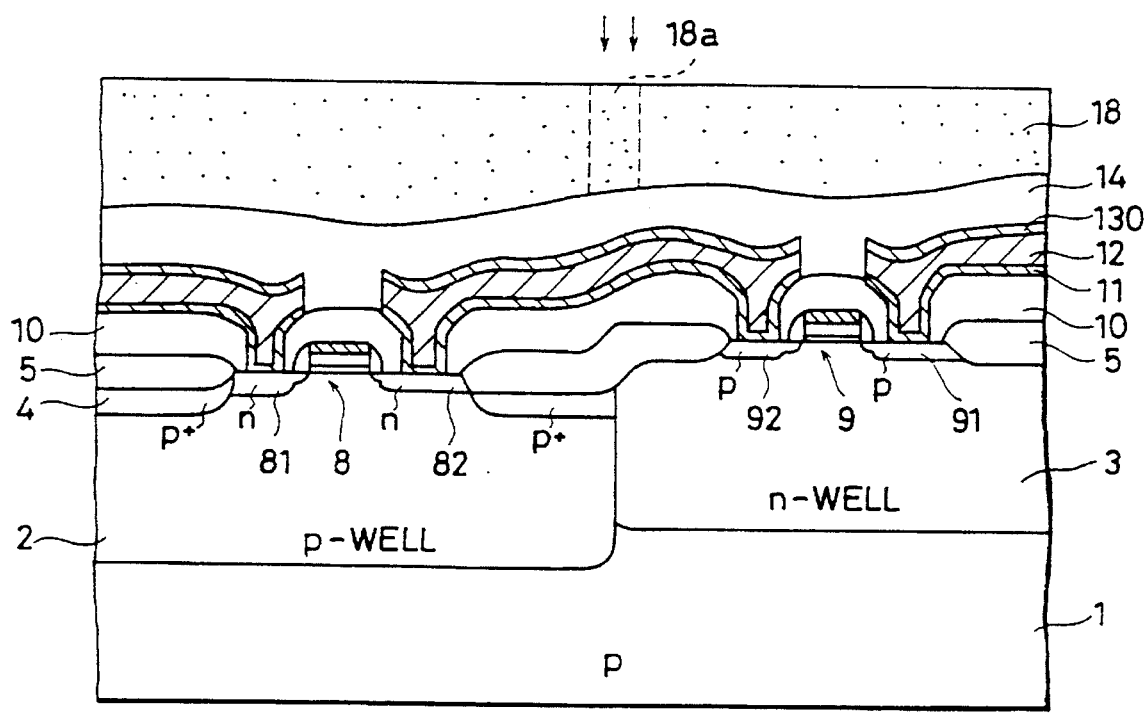
Figure 29:
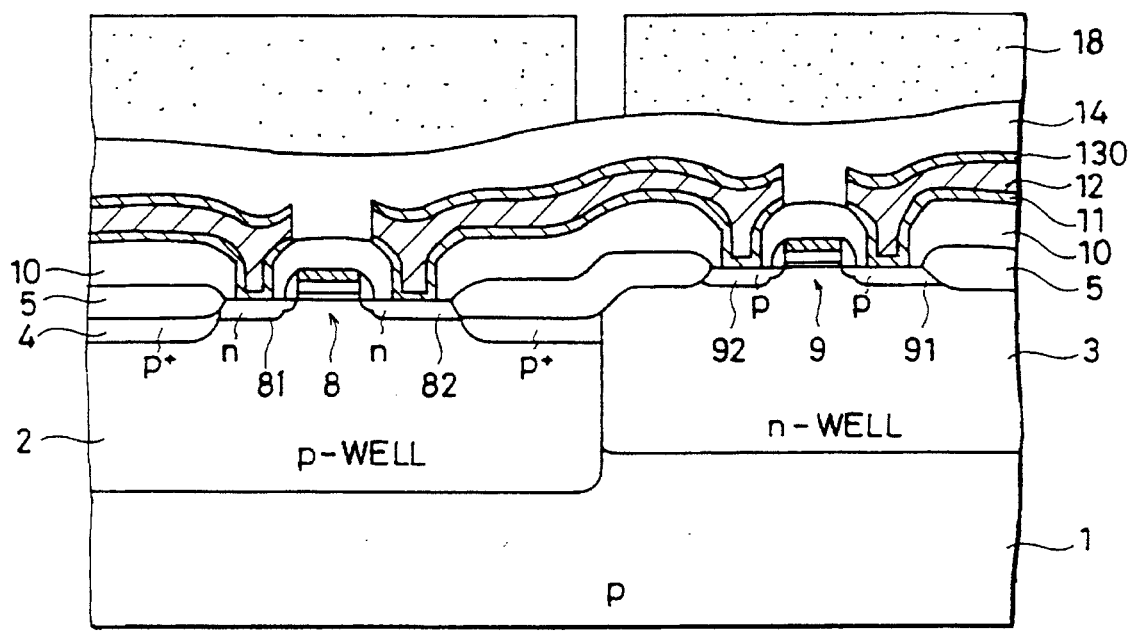
Figure 30:
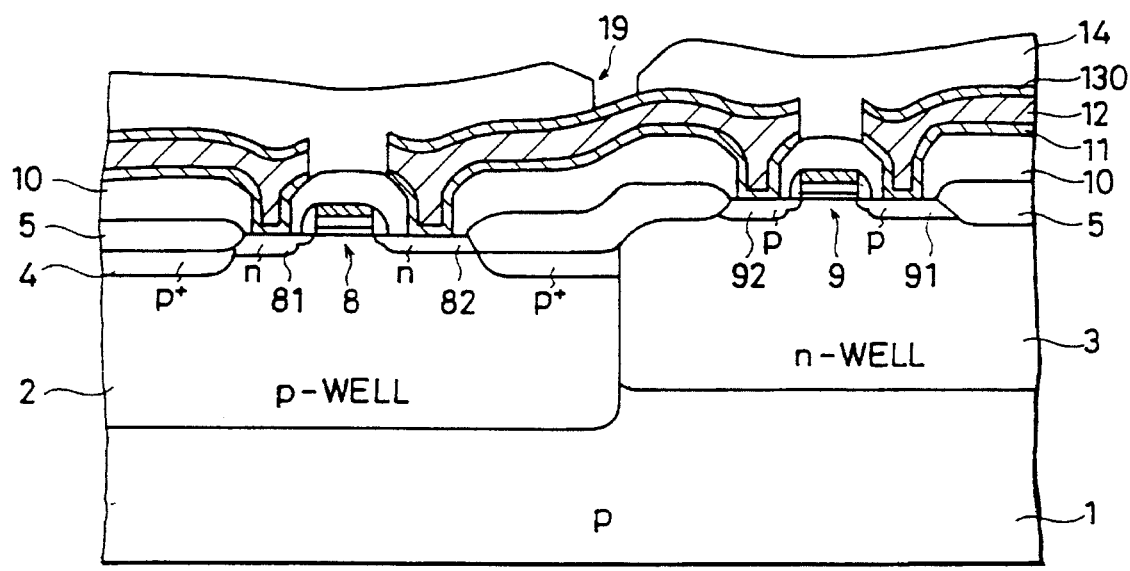
Figure 31:
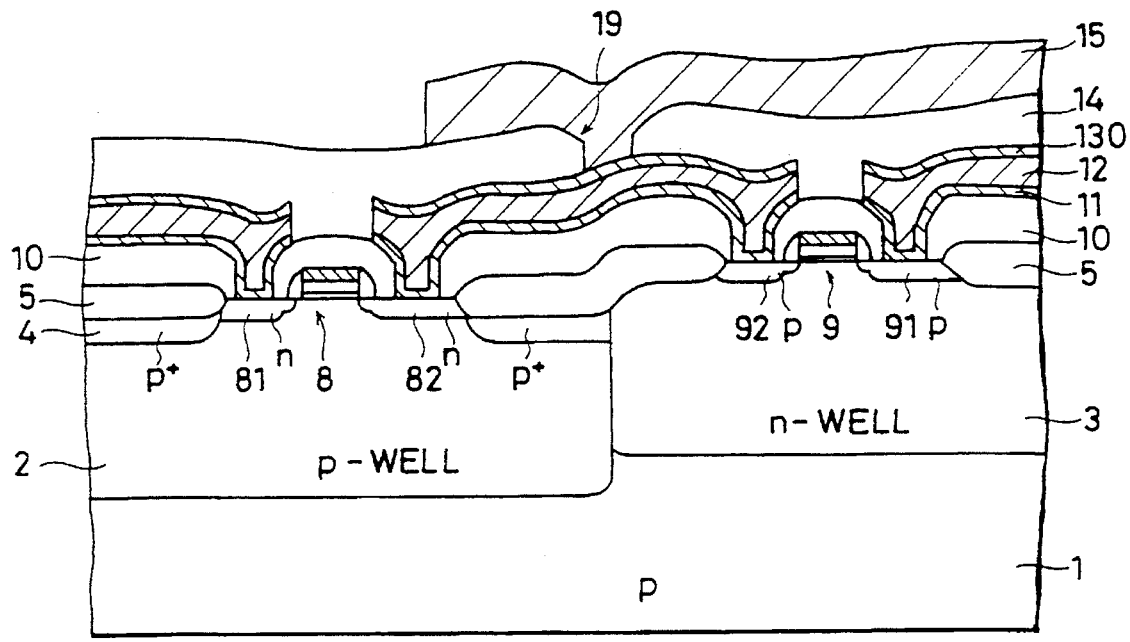
Figure 32:
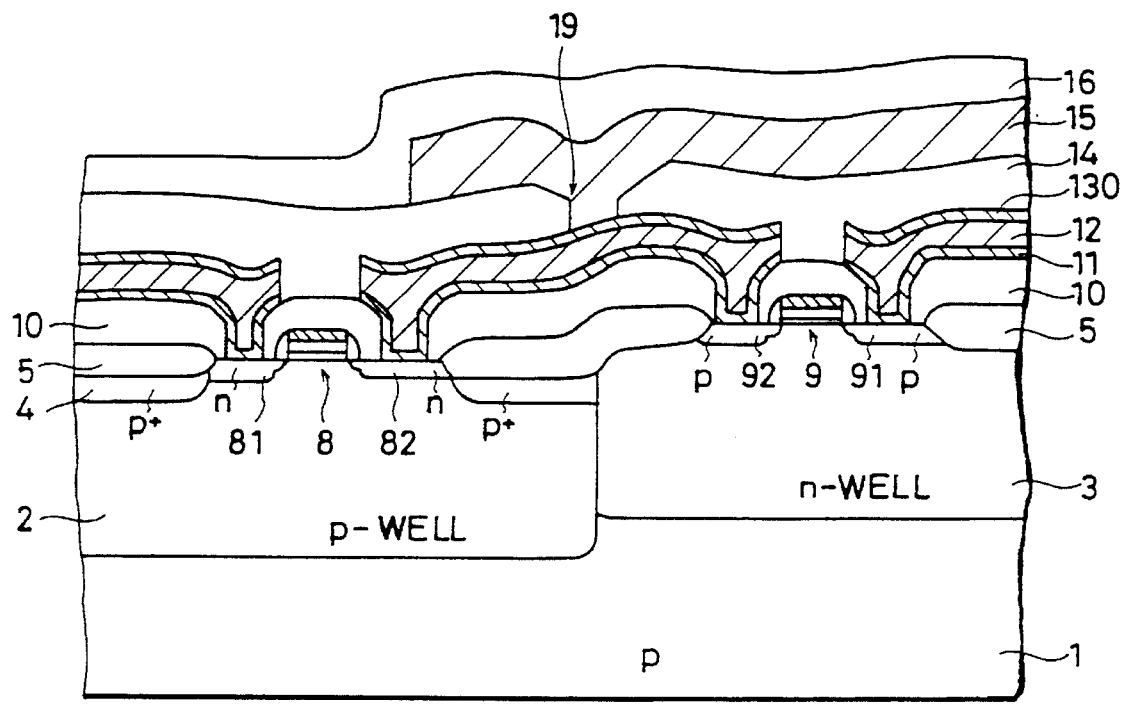
Figure 34:
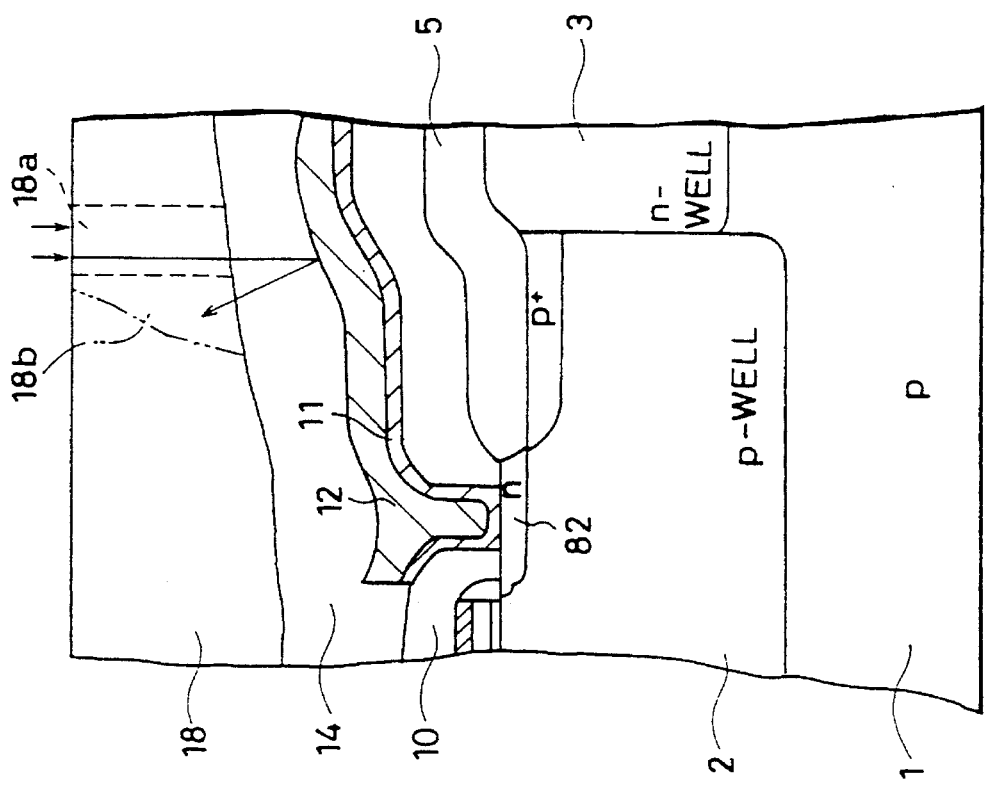
FIG. 34 is a partial sectional view for describing a problem when the photoresist film is subjected to exposure so as to form a through-hole, if the most upper portion of the first aluminum interconnection layer is an aluminum alloy layer.
Figure 33:
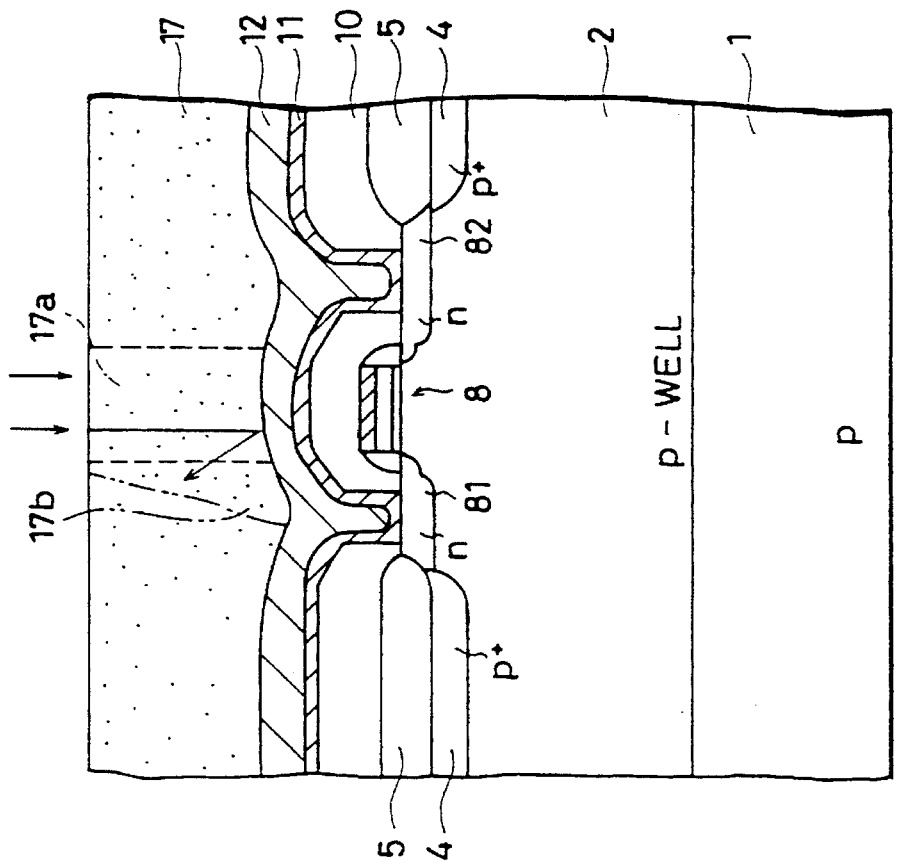
FIG. 33 is a partial sectional view for describing a problem when a photoresist film is subjected to exposure so as to remove a first aluminum interconnection layer selectively, if the uppermost portion of the first aluminum interconnection layer is an aluminum alloy layer.
Figure 36:
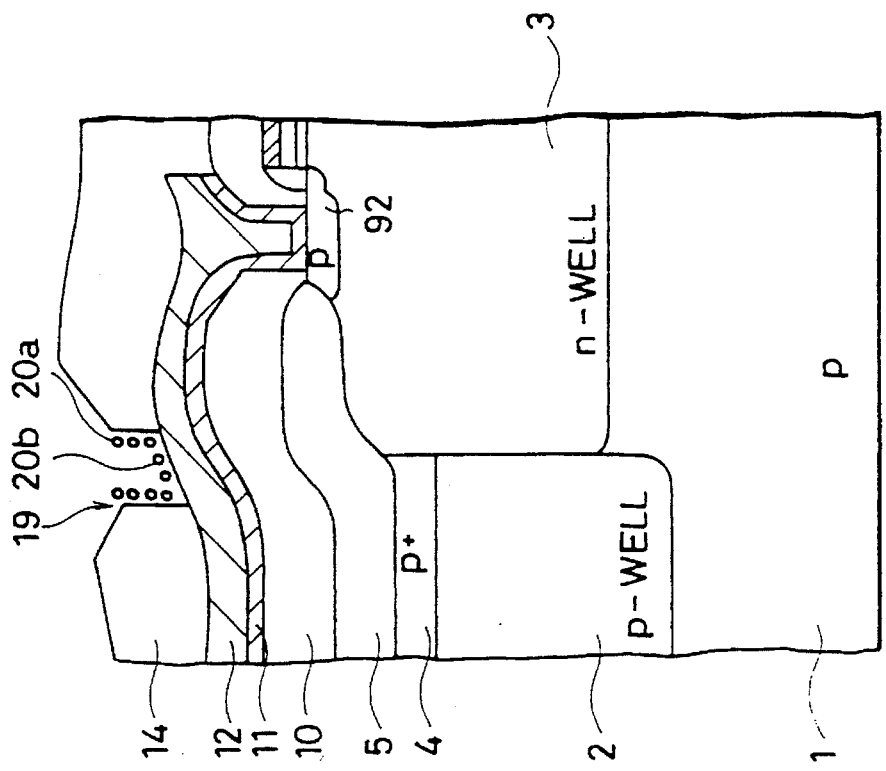
FIG. 36 is a partial sectional view for describing a problem when the through-hole undergoes a cleaning process, if the uppermost portion of the first aluminum interconnection layer is an aluminum alloy layer.
Figure 35:
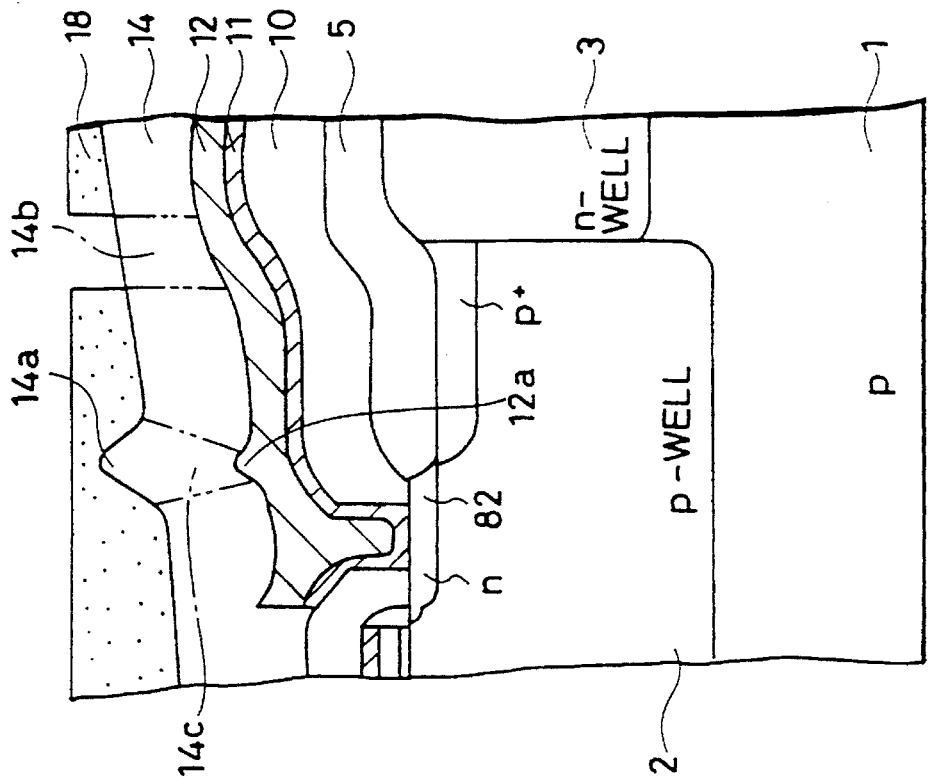
FIG. 35 is a partial sectional view for describing a problem when a hillock is formed in the aluminum alloy layer, if the uppermost portion of the first aluminum interconnection layer is an aluminum alloy layer.

FIG. 19 is a graph showing a relationship between a resistance value of a through-hole (kΩ) and a thickness t2 (Å) of a contact portion of an upper metal layer. A resistance value of a through-hole is measured with lb $10^6$ through-holes, each of which is 0.8×0.8 μm, being connected in a chain. As can be clearly seen from the figure, when a specific resistance value is large, a resistance value of a through-hole changes greatly with a slight change of thickness t2 if, for example, tungsten silicide (WSi) film is used. When a specific resistance value is as small as −12 μΩcm like that of tungsten (W) film (for comparison, a specific resistance value of an aluminum film is −3 μΩcm), a resistance value of a through-hole rises more than expected because refractory metal and aluminum or silicon react in heat treatment and form an alloy layer having a large specific resistance value.

As can be understood from the above reasons, a rise of a resistance value of a through-hole deteriorates device performance and therefore it should be as small as possible. However, if thickness of a contact portion t2=0; it is extremely difficult to remove residues and denatured particles existing on a sidewall of a through-hole or an interface because a surface of an aluminum alloy layer is exposed in an etching step for forming a through-hole. If the residues remain within a through-hole, they may cause a low yield resulting from a poor contact in a through-hole. Therefore, it is desirable that thickness of a contact-portion t2>0 and thickness t2 is close to 0, so that a rise of a resistance value of a through-hole is suppressed as much as possible. Considering that thickness t1 of non-contact portion is preferably 500 Å or more, thickness t2 of a contact portion is desired to be less than 500 Å and as small as possible.

As described above, according to the present invention an index of reflection in the uppermost portion of a first aluminum interconnection layer can be reduced, the formation of a hillock on the surface of an aluminum alloy layer forming the first aluminum interconnection layer can be prevented, and-also reliability of preventing cutoffs of the first aluminum interconnection layer can be enhanced. It is also possible to perform easily a cleaning process of an interface in a contact portion of the first aluminum interconnection layer and the second aluminum interconnection layer and to suppress a rise of a resistance value of a through-hole as well as to maintain the above mentioned advantages.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an interconnection structure for a semiconductor device, comprising the steps of:

forming a first interconnection layer comprising upper and lower conductive layers, one on top of the other;

forming an insulating layer on said first interconnection layer;

forming a through-hole extending completely through said insulating layer and into but not through said upper conductive layer by selectively removing said insulating layer, and said upper conductive layer; and forming a second interconnection layer on said insulating layer, said second interconnection layer extending through said through-hole so as to be in contact with a surface of said upper conductive layer.

2. The manufacturing method of an interconnection structure for a semiconductor device according to claim 1, wherein said step forming the trough-hole includes the step of removing said upper conductive layer by anisotropic etching.

3. The manufacturing method of an interconnection structure for a semiconductor device according to claim 2, wherein said step forming the trough-hole includes the step of controlling time of said anisotropic etching.

4. The manufacturing method of an interconnection structure for a semiconductor device according to claim 2, wherein said step forming the through-hole includes the step of using a gas of at least one selected from a group consisting of $SF_6$, $SiCl_4$, $Cl_2$ and $CF_4$ as an etching gas.

* * * * *